(12) United States Patent
Hattori

(10) Patent No.: US 8,094,095 B2
(45) Date of Patent: Jan. 10, 2012

(54) CURRENT DRIVE CIRCUIT AND DRIVE METHOD THEREOF, AND ELECTROLUMINESCENT DISPLAY APPARATUS USING THE CIRCUIT

(75) Inventor: Reiji Hattori, Fukuoka (JP)

(73) Assignee: Casio Computer Co., Ltd., Tokyo (JP)

( * ) Notice: Subject to any disclaimer, the term of this patent is extended or adjusted under 35 U.S.C. 154(b) by 1080 days.

(21) Appl. No.: 11/854,341

(22) Filed: Sep. 12, 2007

(65) Prior Publication Data

US 2008/0174527 A1    Jul. 24, 2008

Related U.S. Application Data

(60) Division of application No. 10/801,172, filed on Mar. 11, 2004, now abandoned, which is a continuation of application No. PCT/JP03/08153, filed on Jun. 27, 2003.

(30) Foreign Application Priority Data

Jun. 27, 2002    (JP) ................................ 2002-187803

(51) Int. Cl.
    *G09G 3/30*        (2006.01)
    *G09G 3/36*        (2006.01)
(52) U.S. Cl. .......................................... 345/76; 345/98
(58) Field of Classification Search ............... 345/76, 345/98
    See application file for complete search history.

(56) References Cited

U.S. PATENT DOCUMENTS

| | | | |
|---|---|---|---|
| 4,447,812 A | 5/1984 | Soneda et al. | |
| 5,166,671 A | 11/1992 | Maekawa | |
| 5,721,563 A * | 2/1998 | Memida | 345/98 |
| 5,754,155 A | 5/1998 | Kubota et al. | |
| 6,020,865 A | 2/2000 | Okuda et al. | |
| 6,091,203 A | 7/2000 | Kawashima et al. | |

(Continued)

FOREIGN PATENT DOCUMENTS

CN        1287656 A        3/2001

(Continued)

OTHER PUBLICATIONS

Chinese Office Action dated Feb. 6, 2009 (9 pages), and English translation thereof (11 pages) issued in counterpart Chinese Application No. 038011573.

(Continued)

*Primary Examiner* — Amare Mengistu
*Assistant Examiner* — Aaron M Guertin
(74) *Attorney, Agent, or Firm* — Holtz, Holtz, Goodman & Chick, PC

(57) ABSTRACT

A current drive apparatus for an active matrix display operates a plurality of loads, e.g. organic or inorganic EL elements, by applying a current thereto. The apparatus includes a plurality of output terminals to which the loads are respectively connected. A single current generation circuit comprising e.g. a digital to analogue converter and a current mirror, outputs an operating current having a predetermined current value. A plurality of current storage circuits are provided in accordance with the respective output terminals, sequentially sample and hold the operating current and then simultaneously output the drive currents based on the sampled operating currents to the respective output terminals. The operating current has a current value according to an input signal. The current storage circuit includes a voltage component holding section which samples the operating current outputted from the current generation circuit and holds a voltage component for driving a drive control current corresponding to a current value of the operating current for driving a second current mirror.

9 Claims, 20 Drawing Sheets

U.S. PATENT DOCUMENTS

| | | | |
|---|---|---|---|
| 6,222,357 B1 * | 4/2001 | Sakuragi | 323/315 |
| 6,236,394 B1 * | 5/2001 | Ikeda | 345/211 |
| 6,268,842 B1 | 7/2001 | Yamazaki et al. | |
| 6,586,888 B2 | 7/2003 | Kitahara et al. | |
| 6,617,796 B2 * | 9/2003 | Sasaki et al. | 315/169.1 |
| 6,731,273 B2 | 5/2004 | Koyaoma et al. | |
| 6,765,560 B1 | 7/2004 | Ozawa | |
| 2001/0050728 A1 | 12/2001 | Edwards | |
| 2002/0075208 A1 | 6/2002 | Bae et al. | |

FOREIGN PATENT DOCUMENTS

| | | |
|---|---|---|
| EP | 0 478 384 A2 | 4/1992 |
| EP | 1 182 636 A2 | 2/2002 |
| JP | 2000-122607 A | 4/2000 |
| JP | 2000-293245 A | 10/2000 |
| JP | 2003-150112 A | 5/2003 |
| WO | WO 00/22604 | 4/2000 |
| WO | 02/05254 A1 | 1/2002 |
| WO | 03/038796 A1 | 5/2003 |
| WO | 03/038797 A1 | 5/2003 |

OTHER PUBLICATIONS

T. Shima et al; Principle and Appications of an Autocharge-Compensated Sample and Hold Circuit; IEEE; Journal of Solid State Circuits, Aug. 1995, No. 8., pp. 906-911.

* cited by examiner

CURRENT DRIVE CIRCUIT AND DRIVE METHOD THEREOF, AND ELECTROLUMINESCENT DISPLAY APPARATUS USING THE CIRCUIT

CROSS-REFERENCE TO RELATED APPLICATIONS

This application is a Divisional Application of U.S. application Ser. No. 10/801,172 filed Mar. 11, 2004, now abandoned which is incorporated herein by reference and which is also a Continuation Application of PCT Application No. PCT/JP03/08153, filed Jun. 27, 2003, which was not published under PCT Article 21(2) in English.

This application is based upon and claims the benefit of priority from prior Japanese Patent Application No. 2002-187803, filed Jun. 27, 2002, the entire contents of which are incorporated herein by reference.

BACKGROUND OF THE INVENTION

1. Field of the Invention

The present invention relates to a current drive apparatus, a drive method of the current drive apparatus, and a display apparatus using the current drive apparatus, and more particularly to a current drive apparatus including a structure to operate a plurality of loads by applying a predetermined current thereto, a drive method thereof, and a display apparatus which displays desired image information in a display panel by using the current drive apparatus.

2. Description of the Related Art

Conventionally, there is known a light emitting element type display including a display panel in which a plurality of organic electroluminescence elements (which will be referred to as "organic EL elements" hereinafter), inorganic electroluminescence elements (which will be referred to as "inorganic EL elements" hereinafter), or self-luminous type light emitting elements (optical elements) such as light emitting diodes are arranged in a matrix form.

As compared with a liquid crystal display (LCD) which has considerably spread in recent years, such a light emitting element type display has a higher display response speed and no field angle dependency, an increase in contrast, realization of high definition of a display image quality and a reduction in power consumption are possible. Further, a reduction in thickness and weight of one layer is possible since it does not require a back light as different from the liquid crystal display. Thus, it has a very excellent characteristic, so that the light emitting element type display has been studied and developed vigorously as a display of the next generation.

Such a display generally includes a display panel in which display pixels including light emitting elements are arranged in the vicinity of respective intersects of scanning lines arranged in a row direction and data lines arranged in a column direction, a data driver which generates a predetermined drive current according to display data and supplies it to each display element through the data lines, and a scanning driver which causes display pixels in a predetermined row to enter a selection state by applying a scanning signal with a predetermined timing. In such an apparatus, by causing each light emitting element to perform the light emitting operation with a predetermined brightness gradation according to the display data by using the drive current supplied to each display pixel, desired image information is displayed in the display panel. A concrete example of the light emitting element type display will be described in detail in conjunction with a later-described embodiment.

Here, in the display drive operation in the display, there are known a current specification type drive mode which sequentially repeats in accordance with each row for one screen the operation which generates drive currents having individual current values according to the display data with respect to a plurality of display pixels, simultaneously supplies the currents to the display pixels in a specific row and causes the light emitting element of each display pixel to emits the light with a predetermined brightness gradation, and a pulse width modulation (PWM) type drive mode which sequentially repeats for one screen the operation which supplies drive currents having a fixed current value with individual time widths (signal widths) according to the display data relative to a plurality of the display pixels to the display pixels in a specific row in the same display period and causes each light emitting element to emit the light with a predetermined brightness gradation.

In these display drive operations, the drive currents having predetermined current values or a fixed current value according to the display data must be supplied to a plurality of the display pixels in each row at the same time or within the same display period. In order to cope with realization of high definition and a large screen of a thin display device in recent years, there is known a display having applied thereto a circuit configuration which includes a plurality of driver chips (semiconductor chips) each having a predetermined number of output terminals as the above-described data drivers, individually generates the drive currents in the respective driver chips and supplies the drive currents to the respective light emitting elements through a data line at the same time.

The display to which the above-described data driver including a plurality of the driver chips is applied has the following problems.

The conventional data driver having a plurality of the driver chips includes a circuit used to individually generate a drive current in accordance with each driver chip and has a structure to simultaneously supply the drive currents to the respective light emitting elements from the respective driver chips through respective output terminals. Therefore, when irregularities are generated in current values of the drive currents outputted from a plurality of the driver chips, irregularities occur in the light emitting state in each display pixel (brightness gradation of the light emitting element), and the display heterogeneity is produced. Thus, irregularities in the drive currents must be suppressed as much as possible between the respective driver chips and between the respective output terminals.

However, in the field of a semiconductor manufacture technique, there is known the fact that irregularities are necessarily generated in the element characteristic of function elements such as transistor elements, resistance elements or capacitance elements formed on the same semiconductor chip. Such irregularities in the element characteristic can be suppressed to some degree by, e.g., optimizing manufacturing processes, but they cannot be completely eliminated. Further, there has been reported the fact that irregularities in the number of impurity atoms in channels become relatively actual with a reduction in design minimum dimension applied to the transistor elements and irregularities are thereby generated in a threshold value or the mobility.

Therefore, there is a problem that it is very difficult to greatly improve the irregularities in the drive currents between the output terminals of the driver chips caused due to the above-described irregularities in the element characteristic by using only a technique of optimizing the manufacturing processes.

Furthermore, since there is a limit in the number of output terminals which can be set in one semiconductor chip due to a problem of an increase in signal delay owing to an increase in wiring length or to a reduction in production yield with an increase in the number of elements in one chip, the data driver must be necessarily configured by using a plurality of the driver chips. If the semiconductor chips are different from each other, irregularities in the drive currents between the output terminals further become large, and it is very difficult to suppress irregularities in the drive currents in the same driver chip while suppressing the same between the driver chips.

As a technique to correct irregularities in the drive currents in the driver chip, there is known a technique which additionally provides a current setting resistance in accordance with an output terminal of each driver chip and individually adjusts a resistance value of the current setting resistance. In this technique, when the number of the output terminals provided to the same driver chip is increased, adjustment of each current setting resistance becomes complicated, adjustment requires a long time and cost and a resistance setting area in the circuit configuration becomes large. Therefore, it is not suitable as a technique to suppress irregularities in the drive currents between the respective output terminals.

Therefore, in order to suppress irregularities in the drive currents between the output terminals in the same driver chip while also suppressing irregularities between the driver chips, a complicated and large-scale circuit configuration must be added between the respective output terminals and between the respective driver chips. Therefore, the data driver including the driver chips and thus the apparatus scale of the display are increased, and there is a problem that a product cost is increased.

Moreover, as described above, in the display in recent years, although realization of further clearness of gradation display is demanded with realization of high definition in the display image quality, the light emitting element type display which has been currently developed has a problem that it has not reached establishment of a technique to generate an analog output signal which can realize the sufficient gradation display when generating a drive current having an analog signal component from a digital input signal which becomes display data by digital-to-analog conversion.

BRIEF SUMMARY OF THE INVENTION

A current drive apparatus according to the present invention has an advantage to suppress irregularities in currents between output terminals of a current drive apparatus which operates by applying currents to a plurality of loads, and also suppress irregularities between chips when the current drive apparatus constructed by a plurality of driver chips. Further, it has an advantage to obtain the excellent display characteristic with display irregularities being suppressed in a display apparatus including the current drive apparatus.

To achieve this aim, according to a first current drive apparatus of the present invention, there is provided a current drive apparatus which operates a plurality of loads by applying currents thereto, comprising: a plurality of output terminals to which the loads are connected, respectively; a single current generation circuit which outputs an operating current having a predetermined current value; and a plurality of current storage circuits which are provided in accordance with each of the output terminals, sequentially fetch and hold the operating current and simultaneously output drive currents based on the operating current to the respective output terminals. The operating current has a current value according to an input signal, the current storage circuit includes a voltage component holding portion which fetches the operating current outputted from the current generation circuit and holds a voltage component corresponding to a current value of the operating current, and the voltage component holding portion has a capacitance element in which an electric charge corresponding to the operating current is written. Each of the current storage circuits preferably includes a pair of current storage sections which are arranged in parallel and in which an operation to fetch and hold the operating current and an operation to output the drive current based on the held operating current are alternately carried out in parallel, or includes current storage sections on front and rear stages which are arranged in series and in which an operation to fetch and hold the operating current and supply the held current to the current storage section on the rear stage and an operation to fetch and hold the supplied current and output the drive current based on the held current are carried out in parallel.

The current drive apparatus may include a signal input current storage circuit between the current generation circuit and a plurality of the current storage circuits, which fetches and holds the operating current and supplies a current based on the held operating current to a plurality of the current storage circuits so that the drive currents have the sane current value at the respective output terminals, and include a pulse width control circuit which controls a pulse width of each of the drive current in accordance with an input signal.

Preferably, at least a plurality of the current storage circuits and the output terminals in the current drive apparatus are formed on at least one semiconductor chip, and the current generation circuit is formed on a semiconductor chip different from the former semiconductor chip or formed in the former semiconductor chip.

To achieve the above-described aim, according to a second current drive apparatus of the present invention, there is provided a current drive apparatus which operates a plurality of loads by applying currents thereto, comprising: a plurality of output terminals to which the load are connected, respectively; a single reference current generation circuit which generates and outputs a plurality of reference currents having current values different from each other; at least one reference current storage circuit which fetches and holds each of the plurality of reference currents and outputs a plurality of gradation reference currents based on the respective reference currents; a plurality of current generation circuits which select any of the respective gradation reference currents and generate a gradation current in accordance with an input signal; and a plurality of current storage circuits which sequentially fetch and hold the respective gradation currents and simultaneously output drive currents based on the gradation currents to the respective output terminals. The reference current generation circuit can include a plurality of reference current generation sections which generate and output the respective reference currents and are arranged in parallel, the input signal is a digital signal having a plurality of bits, and a current value of the reference current outputted from each of the reference current generation sections can have a weight corresponding to each bit of the digital signal. The reference current storage circuit preferably includes a plurality of reference current storage sections which individually fetch the respective reference currents outputted from the reference current generation circuit, hold voltage components corresponding to the respective reference currents and output the gradation reference currents based on the respective voltage components, and each of the current generation circuits selects any of the gradation reference currents outputted from the respective reference current storage sections based on a bit value of the input signal, adds the selected gradation reference current and generates the gradation current. The current storage circuit can include a voltage component holding portion which fetches the gradation current outputted from the current generation circuit and holds a voltage component corresponding to a current value of the gradation current, and the voltage component holding portion has a capacitance element in which the an electric charge corresponding to the gradation current is written as the voltage component.

According to a display apparatus of the present invention, there is provided a display apparatus which supplies a drive current corresponding to a display signal to each display pixel of a display panel including a plurality of display pixels, comprising: a display panel which includes a plurality of display pixels having optical elements which are arranged in the vicinity of intersections of a plurality of scanning lines arranged in a line direction and a plurality of signal lines arranged in a row direction; a signal drive circuit including any of a structure of the first current drive apparatus which includes a single current generation circuit which generates and outputs an operating current having a current value based on the display signal, and a plurality of current storage circuits which are provided in accordance with the respective signal lines, sequentially fetch the operating current outputted from the current generation circuit and simultaneously output a drive current based on the operating current to a plurality of the signal lines, or a structure of the second current drive apparatus which includes a single reference current generation circuit which generates and outputs a plurality of reference currents having current values different from each other, at least one reference current storage circuit which fetches and holds the respective reference currents and outputs a plurality of gradation reference currents based on the respective reference currents, at least one current generation circuit which selects any of the respective reference currents and generates and outputs a gradation current, and a plurality of current storage circuits which are provided in accordance with the respective signal lines, sequentially fetch and hold the gradation current outputted from the current generation circuit, and simultaneously output a drive current based on the gradation current to a plurality of the signal lines; and a scanning drive circuit which outputs a scanning signal used to sequentially select the display pixels connected to the scanning lines, the optical element in the display pixel having a light emitting element, and the optical element having an organic electro luminescent element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A current drive apparatus, a drive method thereof, and a display apparatus to which the current drive apparatus is applied according to the present invention will now be described based on illustrated embodiments.

First, a current drive apparatus and a drive method thereof will be described with reference to the accompanying drawings.

First Embodiment of Current Drive Apparatus

Figure 1:
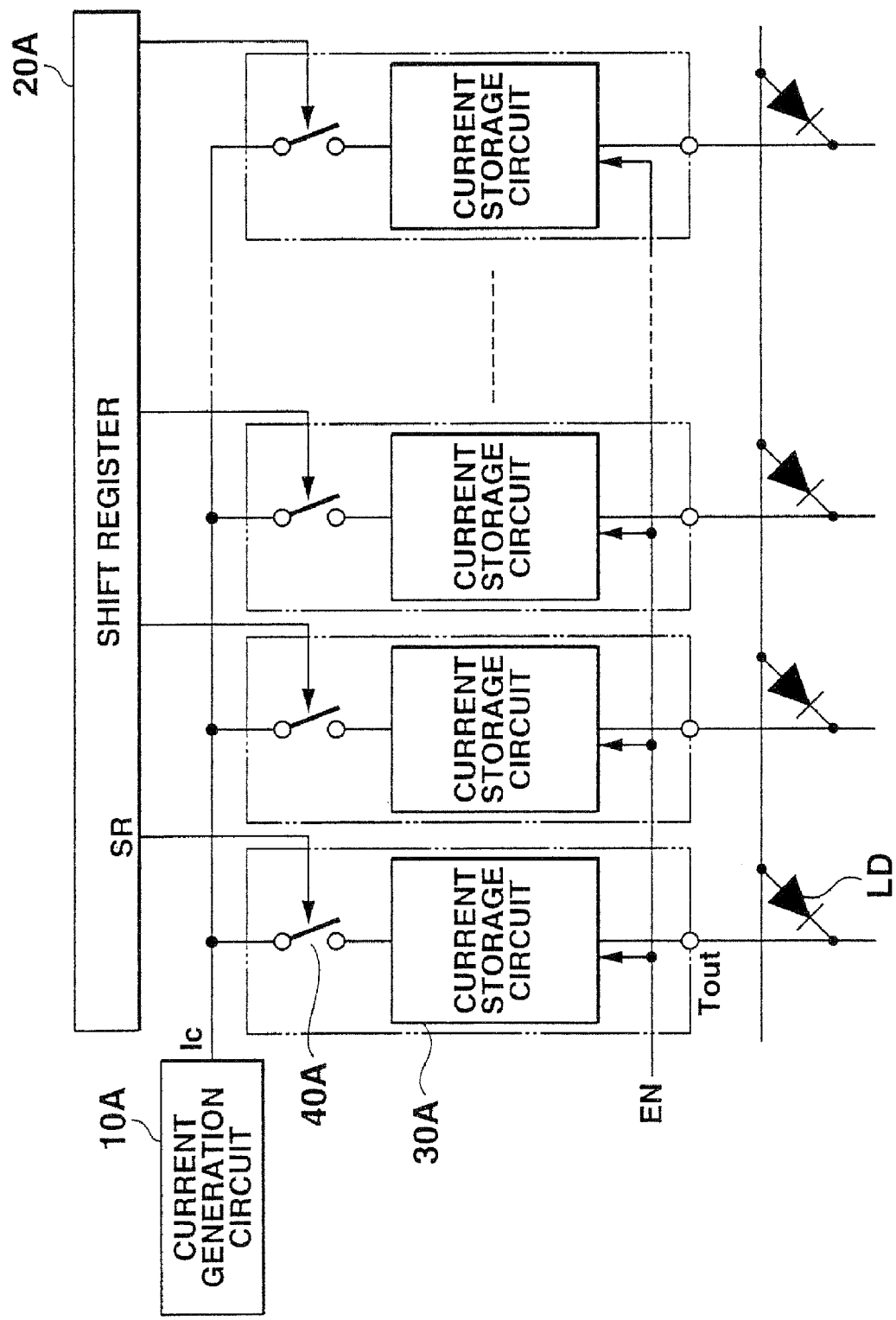
FIG. 1 is a primary structural view showing a first embodiment of a current drive apparatus according to the present invention.

FIG. 1 is a primary structural view showing a first embodiment of a current drive apparatus according to the present invention.

The current drive apparatus according to the first embodiment has a structure to sequentially hold a current with a predetermined current value supplied from a single current generation circuit in a current storage circuit provided in accordance with each output terminal and thereafter simultaneously output the currents to loads (display elements) through each of the output terminals.

Figure 17:
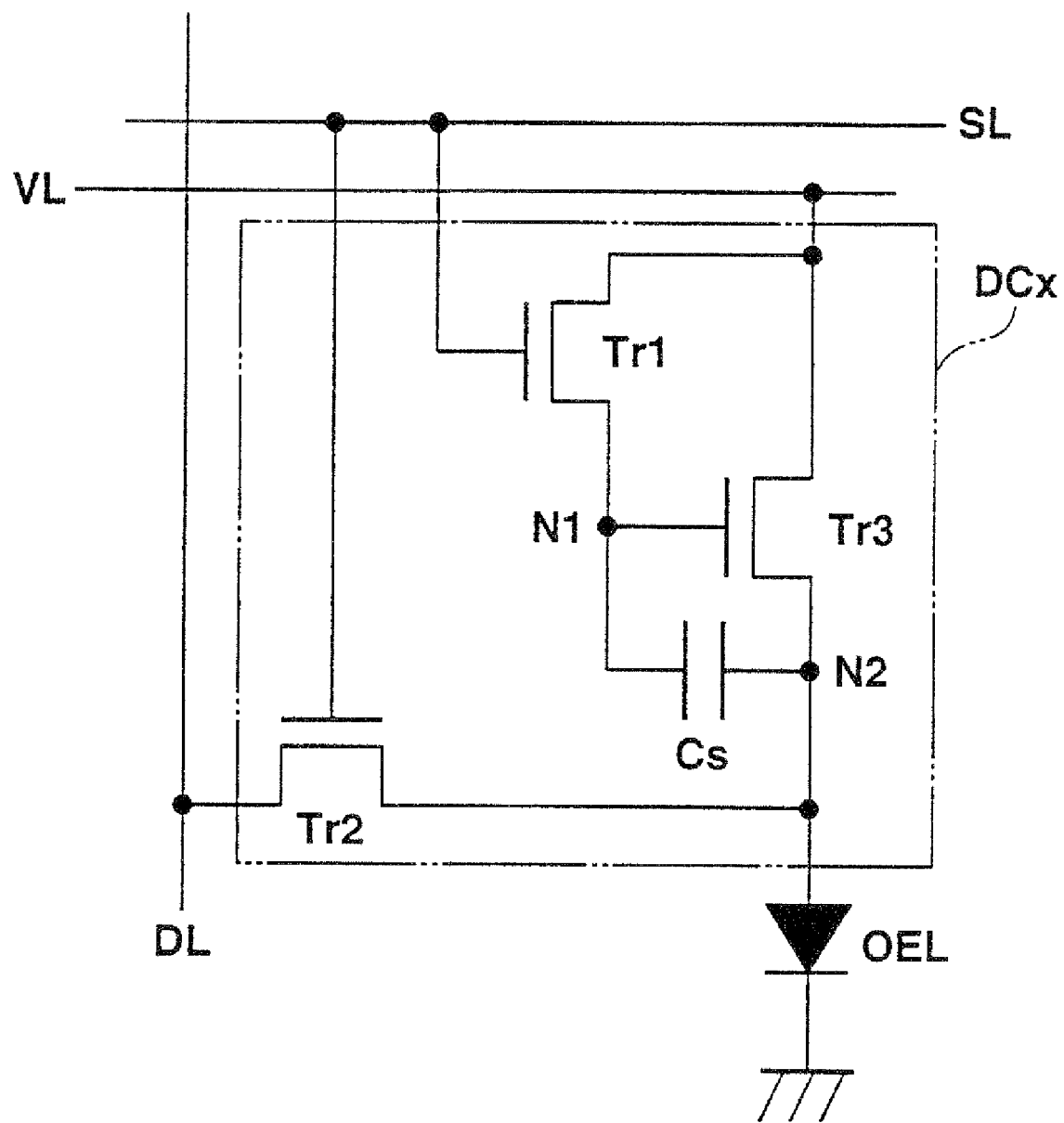
FIG. 17 is a circuit configuration view showing an example of a basic structure of a pixel drive circuit applicable to the display apparatus according to the present invention.

As shown in FIG. 1, the current drive apparatus according to this embodiment comprises: a single current generation circuit 10A which generates and outputs an operating current Ic having a predetermined current value used to control a drive stage of each load LD (display element) connected to each of a plurality of output terminals Tout; a shift register 20A which sets a timing when supplying the operating current Ic supplied from the current generation circuit 10A to each of later-described current storage circuits 30A; a plurality of current storage circuits 30A which are provided in accordance with output terminals Tout, sequentially fetch and hold (store) the operating current Ic supplied from the current generation circuit 10A with a predetermined timing based on the shift register 20A; and a plurality of switch circuits 40A which control a supply state of the operating current Ic from the current generation circuit 10A to each of the current storage circuits 30A based on a timing set by a switch changeover signal (shift output) SR outputted from the shift register 20A with a predetermined timing. In FIG. 1, although the loads LD (display elements) are illustrated in a case that they are applied in a simple matrix type display panel, they are not restricted thereto, and they can be applied to an active matrix type display panel including such a pixel drive circuit as shown in FIG. 17.

Figure 2:
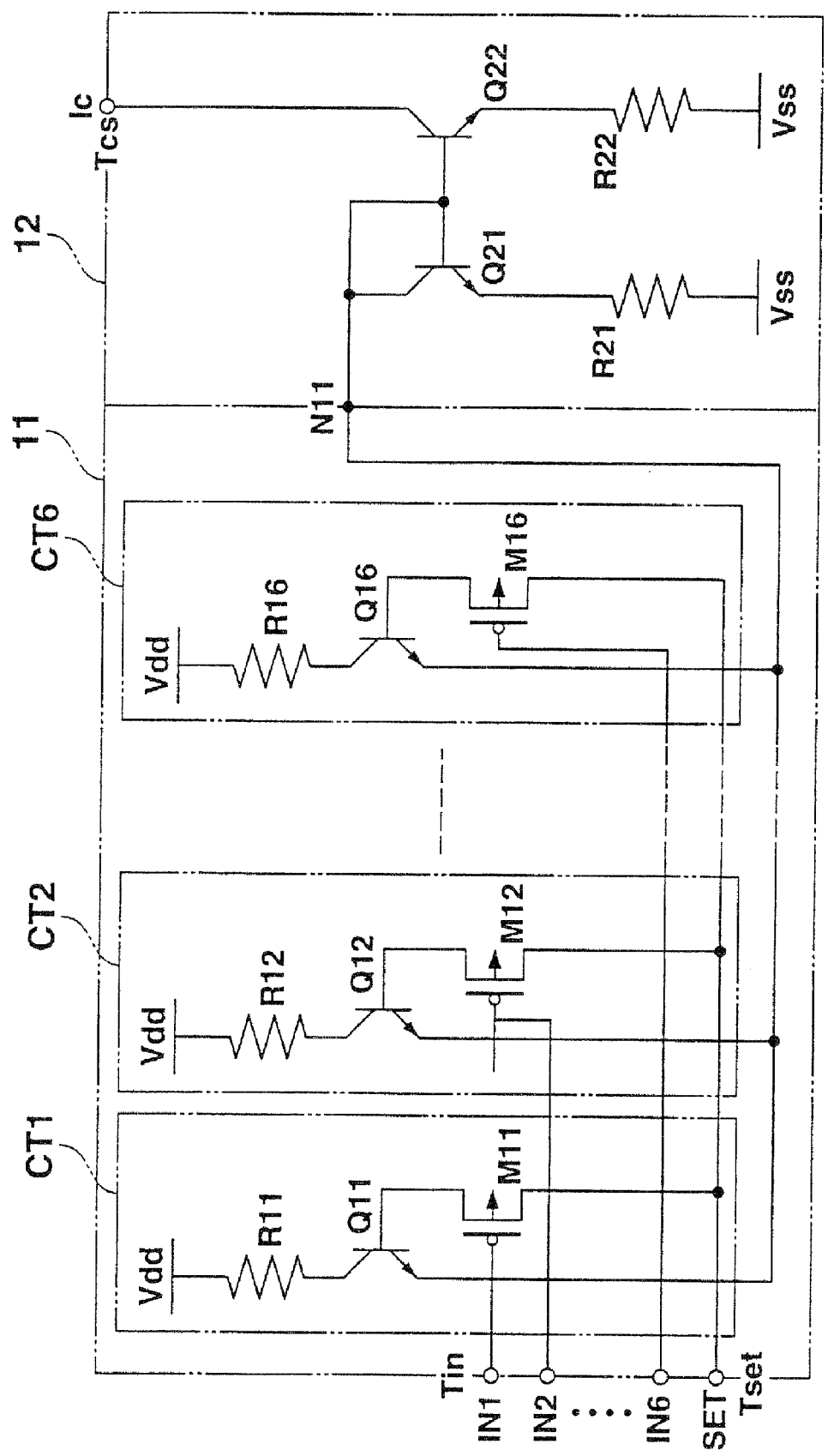
FIG. 2 is a circuit structural view showing a concrete example of a current generation circuit applicable to the embodiment.

Each of the above structures will now be concretely described hereinafter.
(Current Generation Circuit)
FIG. 2 is a circuit structural view showing a concrete example of the current generation circuit applicable to this embodiment.

The current generation circuit 10A substantially generates each operating current Ic having a current value required to drive each of a plurality of the loads in a predetermined drive state, and outputs it to individual current storage circuits 30A provided so as to correspond to each of a plurality of the loads. The current generation circuit 10A is constituted by, e.g., a control current generation circuit 11 on a front stage and an output current generation circuit 12 on a rear stage, as shown in FIG. 2.

The operating currents Ic generated by the current generation circuit 10A may have current values different from each other in accordance with a drive stage of each load, or may have the same current value with respect to all the loads. The detail will be described later.

The current generation circuit illustrated in this embodiment is just an example applicable to the current drive apparatus according to the present invention, and it is not restricted to this circuit configuration. In this embodiment, as the current generation circuit, a structure comprising the control current generation circuit 11 and the current mirror circuit portion 12 is illustrated, but it is not restricted thereto. For example, it may have a circuit configuration consisting of only the control current generation circuit.

As shown in FIG. 2, in the control current generation circuit 11, as a unit circuit (bit current generation circuit) CT1 having a circuit configuration comprising: a resistance R11 having one end side connected to a high-potential power supply Vdd; a pnp type bipolar transistor (which will be referred to as a "pnp transistor" hereinafter) Q11 having an emitter connected to the other end side of the resistance R11 and a collector connected to an output junction N11 of the control current generation circuit 11 connected to the output current generation circuit 12 on the rear stage; and a P-channel field effect type transistor (which will be referred to as a "PMOS transistor" hereinafter) M11 having a source connected to a base of the pnp transistor Q11, a drain connected to a set terminal Tset to which a set signal SET is inputted and a gate connected to an input terminal Tin to which a digital input signal IN1 is inputted. The unit circuits are connected in parallel for the number of bits of the digital input signals (in this embodiment, description will be given as to a case that unit circuits CT1 to CT6 corresponding to digital input signals IN1 to IN6 of six bits are provided). That is, emitters of the pnp transistors Q11 to Q16 of the respective unit circuits CT1 to CT6 are connected to the output junction N11 in common, and there are provided the PMOS transistors M11 to M16 having sources connected to the bases of the pnp transistors Q11 to Q16, drains connected to the set terminal Tset and gates connected to input terminals Tin to which the digital input signals IN1 to IN6 are inputted.

Here, the input signals IN1 to IN6 are digital signals (voltage components) consisting of a plurality of bits used to control a drive state of each load, and the set signal SET is a signal voltage which is supplied from a non-illustrated control portion with a timing according to a drive cycle and the like of the loads. Such a control current generation circuit 11 generates control currents having current values corresponding to current values of the input signals IN1 to IN6 by setting the set signal SET to a predetermined voltage level and setting the input signals IN1 to IN6 having the respective bits to a high level or a low level, and outputs the control currents to the output current generation circuit 12 on the rear stage through the output junction N11.

For example, as shown in FIG. 2, the output current generation circuit 12 is constituted by a current mirror circuit, and comprises: an npn type bipolar transistor (which will be referred to as an "npn transistor" hereinafter) Q21 having a collector and a base connected to the output junction N11 of the control current generation circuit 11; a resistance R21 connected between an emitter of the npn transistor Q21 and a low-potential power supply Vss; an npn transistor Q22 having a collector connected to an output terminal Tcs where an output current (operating current) Ic having a predetermined current component is outputted and a base connected to the output junction N11 of the control current generation circuit 11; and a resistance R22 connected between an emitter of the npn transistor Q22 and the low-potential power supply Vss.

Here, the output current Ic is generated by the control current generation circuit 11, and has a current value according to a predetermined current ratio stipulated by the current mirror circuit structure with respect to a current value of the control current inputted through the output junction N1. In this embodiment, by supplying the output current having the negative polarity to the current storage circuit 30A (namely, by setting the current flow direction of the output current Ic in a direction of the low-potential power supply Vss from the output terminal Tcs side), the current component flows down so as to be pulled in a direction of the current generation circuit 10A from the current storage circuit 30A side.

In the current generation circuit 10A illustrated in this embodiment, the current value of the control current generated by the control current generation circuit 11 is set larger than the current value of the output current generated by the current mirror circuit portion 12. The current value of the control value is reduced by the current mirror circuit portion 12 with a predetermined ratio in order to stipulate the current value of the output current (that is, the current value processed in the control signal generation circuit 11 is set larger than the current value of the output current Ic). Therefore, it is possible to improve a processing speed concerning conversion and generation to the output current Ic from the input signals IN1 to IN6 in the control signal generation circuit 11 of the current generation circuit 10A.

Further, in the circuit configuration shown in FIG. 2, it is also possible to employ the circuit configuration which stipulates the current ratio by using only an area ratio of the npn transistors Q21 and Q22 in place of resistances R21 and R22 which are connected to the emitters of the npn transistors Q21 and Q22 constituting the current mirror circuit portion 12, i.e., by eliminating the resistances R21 and R22. As a result, it is possible to suppress occurrence of irregularities in the current component within the circuit caused due to the resistances R21 and R22, thereby greatly restraining the influence to the output current Ic.

(Shift Register)

The shift register 20a shown in FIG. 1 sequentially applies a shift output generated based on control signals (a shift start signal, a shift clock signal and others) supplied from a non-illustrated control portion while sequentially shifting in one direction to each of the switch circuits 40A provided in accordance with the respective loads as a switch changeover signal (switch-on signal) SR.

(Switch Circuit)

The switch circuits 40A shown in FIG. 1 perform the on operation with different timings based on the switch changeover signals SR sequentially supplied from the shift register 20A, set the output current (operating current) Ic from the current generation circuit 10A in the write state to supply it to the current storage circuits 30A provided in accordance with the respective loads, and control in such a manner that the output current Ic can be fetched and held in each current storage circuit 30A. Here, as the switch circuit 40A, for example, a field effective type transistor can be applied. In this case, the switch circuits 40A can be formed on the same substrate by using the same manufacturing process as that of the circuit element applied to the later-described current storage circuits 30A. The detail will be described with reference to FIG. 3.

(Current Storage Circuit)

Figure 3:
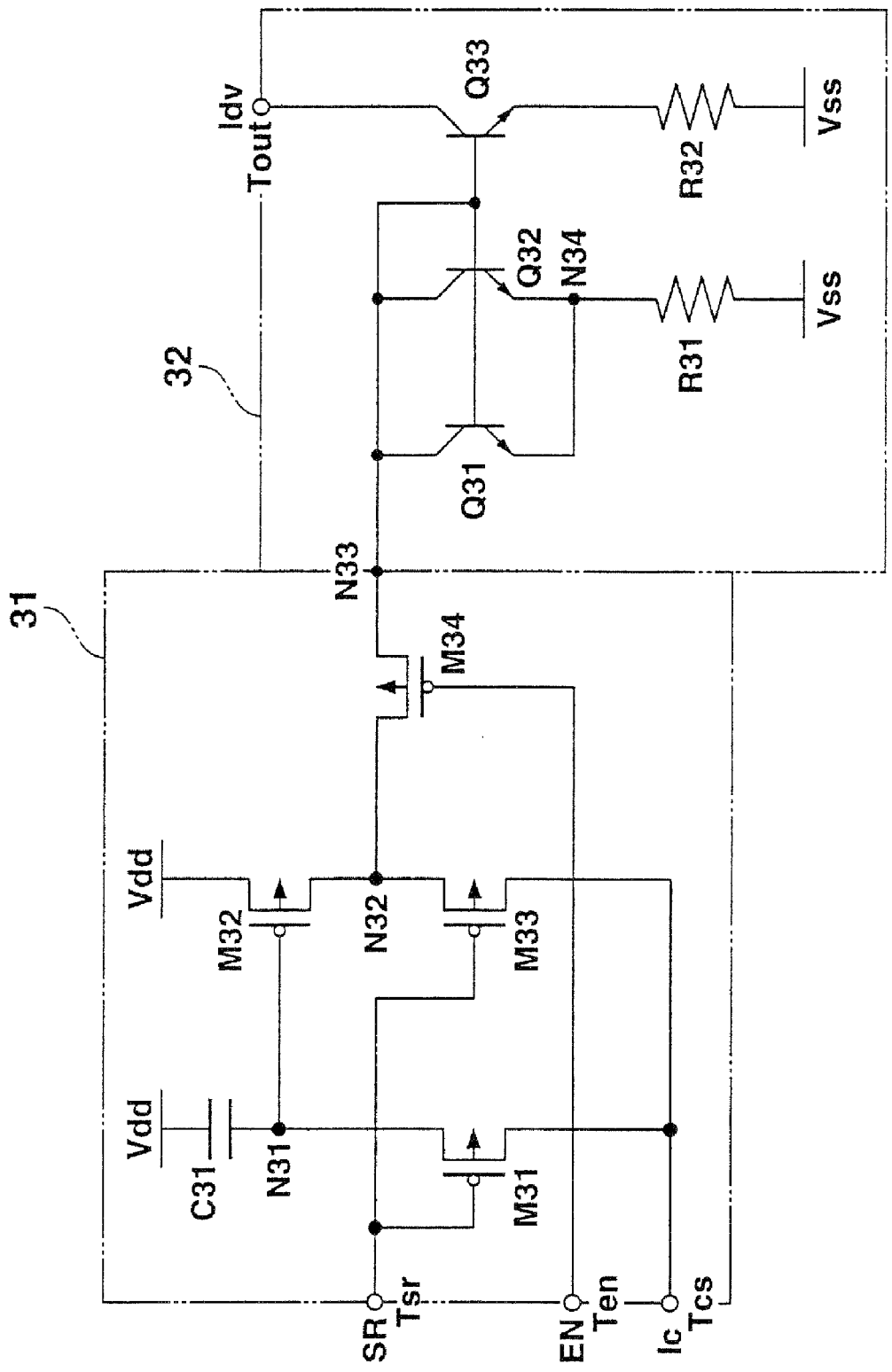
FIG. 3 is a circuit structural view showing a concrete example of a structure consisting of a current storage circuit and a switch circuit applicable to the embodiment.
Figure 4A:
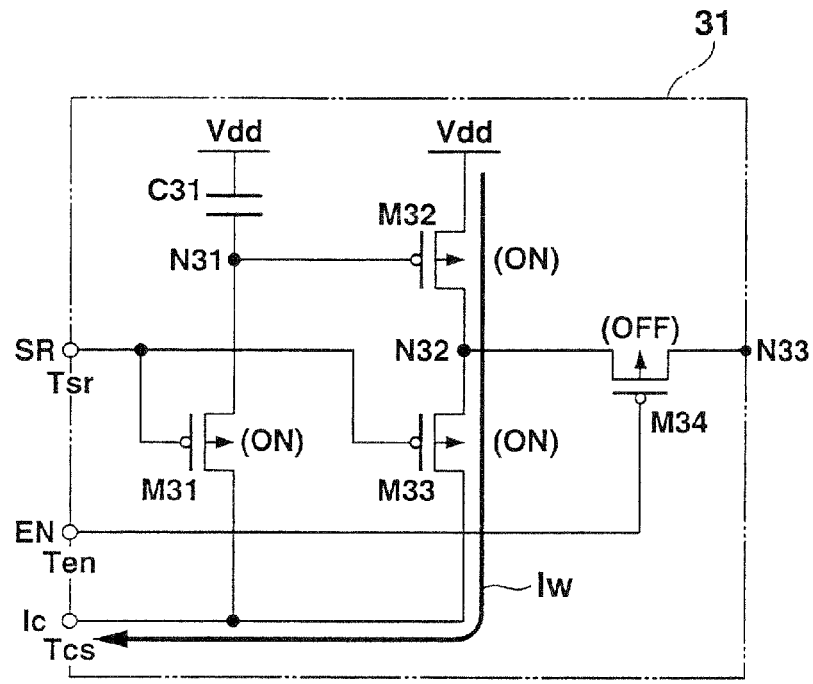
FIGS. 4A and 4B are conceptual views showing a basic operation in the current storage circuit applicable to the embodiment.
Figure 4B:
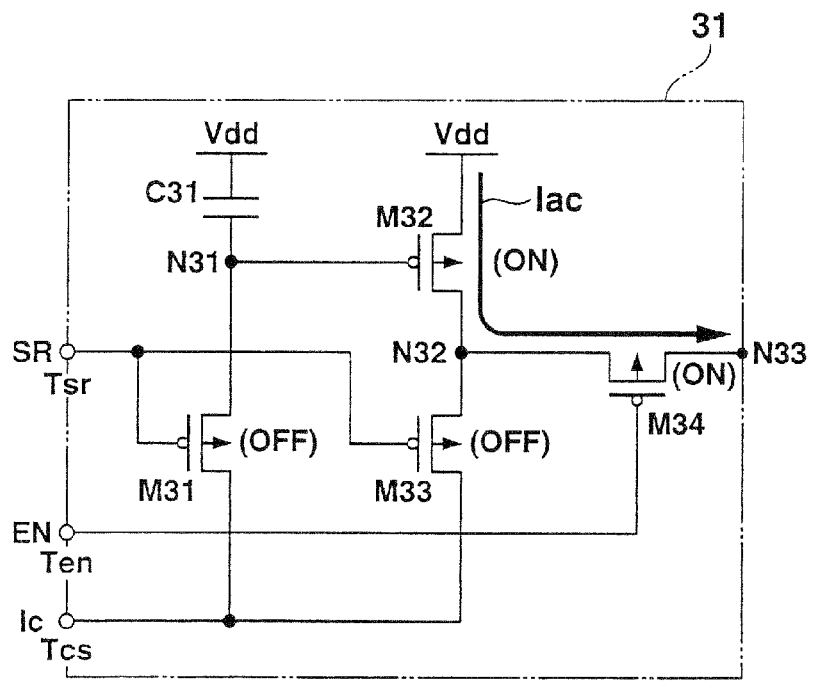

FIG. 3 is a circuit configuration view showing a concrete example of a structure of a current storage circuit and a switch circuit applicable to this embodiment, and FIGS. 4A and 4B are conceptual views showing a basic operation in the current storage circuit applicable to this embodiment.

The current storage circuit 30A substantially sequentially fetches the operating current Ic outputted from the current generation circuit 10A with a predetermined timing based on the shift register 20A, holds a voltage component corresponding to this current, and simultaneously outputs a drive current based on the held voltage component to each load through each output terminal Tout. As shown in FIG. 3, this current storage circuit 30A can comprise, e.g., a voltage component holding portion 31 (including the switch circuit 40A) on a front stage and a drive current generation portion 32 constructed by a current mirror circuit on a rear stage.

The current storage circuit illustrated in this embodiment is just an example applicable to the current drive apparatus according to the present invention, and it is not restricted to this circuit configuration. Furthermore, in this embodiment, as the current storage circuit, although a structure including the drive current generation portion having the voltage component holding and the current mirror circuit is illustrated, the current storage circuit is not restricted thereto, and it may have a circuit configuration having, e.g., only the voltage component holding.

For example, as shown in FIG. 3, the voltage component holding portion 31 comprises: a PMOS transistor M31 having a source connected to a junction N31, a drain connected to an output terminal Tcs of the current generation circuit 10A and a gate connected to a shift output terminal Tsr of the shift register; a PMOS transistor M32 having a source and a drain respectively connected to a high-potential power supply Vdd and a junction N32 and a gate connected to the junction N31; a PMOS transistor M33 having a source and a drain respectively connected to the junction N32 and the output terminal Tcs of the current generation circuit 10A and a gate connected to the shift output terminal Tsr of the shift register 20A; a storage capacitance C31 connected between the high-potential power supply Vdd and the junction N31; and a PMOS transistor M34 having a source and a drain respectively connected and the junction N32 and an output junction N33 to the drive current generation portion 32 on the rear stage and a gate connected to an output control terminal Ten to which an output enable signal EN which is supplied from a non-illustrated control portion and controls an output state of the control current to the drive current generation portion 32 on the rear stage is inputted.

Here, the PMOS transistors M31 and M33 which perform on/off operation based on the switch changeover signal SR from the shift register 20A constitute the above-described switch circuit 40A.

The storage capacitance C31 provided between the high-potential power supply Vdd and the junction N31 may be a parasitic capacitance between the gate and the source of the PMOS transistor M32.

For example, as shown in FIG. 3, the above-described drive current generation portion 32 comprises: npn transistors Q31 and Q32 constituted by the current mirror circuit, each of which has a collector and a base connected to an output junction N33 of the voltage component holding 31 and an emitter connected to a junction N34; a resistance R31 connected between the junction N34 and a low-potential power supply Vss; an npn transistor Q33 having a collector connected to an output terminal Tout from which an output current (drive current Idv) is outputted and a base connected to the output junction N33 of the voltage component holding 31; and a resistance R32 connected between the emitter of the npn transistor Q33 and the low-potential power supply Vss.

Here, the output current (drive current Idv) has a current value corresponding to a predetermined current ratio stipulated by the current mirror circuit configuration with respect to a current value of the control current outputted from the voltage component holding portion 31 and inputted through the output junction N33. In this embodiment, by supply the output current having the negative polarity to the output terminal Tout (load LD) (that is, by setting the current flow direction of the drive current Idv to a direction of the low-potential power supply Vss from the output terminal Tout side), the current component flows down so as to be pulled in the direction of the current storage circuit 30A from the load LD side.

In the current storage circuit 30A illustrated in this embodiment, a current value of the control current outputted from the voltage component holding portion 31 is set larger than a current value of the output current generated by the current mirror circuit of the drive current generation portion 32. The current value of the control current is reduced by the current mirror circuit with a predetermined ratio in order to stipulate the current value of the output current. That is, by setting the current value processed inside the voltage component holding 31 larger than the current value of the drive current Idv, it is possible to increase a processing speed concerning the fetch holding (storage) and the output operation of the operating current Ic in the voltage component holding 31 of the current storage circuit 30A.

In the circuit configuration shown in FIG. 3, by applying a circuit configuration which stipulates the current ratio by using only an area ratio of the npn transistors Q31 to Q33 in place of the resistors R31 and R32 which are connected to the emitters of the npn transistors Q31 to Q33 constituting the current mirror circuit of the drive current generation circuit 32 and stipulate the current ratio in the current mirror circuit configuration, i.e., by eliminating the resistances R31 and R32, it is possible to suppress occurrence of irregularities in the current components within the circuit caused to due to the resistances R31 and R32, and irregularities in the output current (drive current Idv) can be greatly restrained.

As to the basic operation in the current storage circuit (including the switch circuit) having such a structure, the current storage operation and the current output operation are executed with respect to the drive cycle of the load with a predetermined timing by which overlap in time is not generated. Each operation will now be described hereinafter.

(Current Storage Operation)

In the current storage operation, as shown in FIG. 4A, the PMOS transistor M34 as the output control circuit performs the off operation by applying a high-level output enable signal EN from the control portion through the output control terminal Ten. In this state, the operating currents Ic having the current component with negative polarity corresponding to the input signals IN1 to IN6 used to control the drive states of the loads are supplied from the current generation circuit 10A through the input terminal Tcs (output terminal Tcs of the current generation circuit 10A), and the low-level switch changeover signal SR is applied with a predetermined timing from the shift register 20A through the shift output terminal Tsr. As a result, the PMOS transistors M31 and M33 as the input control circuits (switch circuits 40A) perform the on operation.

Consequently, the voltage level as the low level corresponding to the operating currents Ic with the negative polarity is applied to the junction N31 (namely, the gate terminal of the PMOS transistor M32 and one end of the storage capacitance C31), and a potential difference is generated between the high-potential power supply Vdd and the junction N31 (between the gate and the source of the PMOS transistor M32). As a result, the PMOS transistor M32 carries out the on operation, a write current Iw equivalent to the operating current Ic flows down so as to be pulled in a direction of the input terminal Tcs through the PMOS transistors M32 and M33 from the high-potential power supply.

At this moment, the electric charges corresponding to the potential difference generated between the high-potential power supply Vdd and the junction N31, i.e., between the gate and the source of the PMOS transistor M32 are stored in the storage capacitance C31, and the electric charges are held as a voltage component corresponding to the operating current Ic. Here, to the electric charges stored in the storage capacitance C31 are held even after pulling of the write current Iw is stopped by applying the high-level switch changeover signal SR from the shift register 20A through the shift output terminal Tsr upon completion of the current storage operation to the PMOS transistors M31 and M33 which perform the off operation.

(Current Output Operation)

Subsequently, in the load drive operation after termination of the current storage operation, as shown in FIG. 4B, the PMOS transistor M34 performs the on operation by applying the output enable signal EN on the low level from the control portion through the output control terminal Ten. At this moment, since the potential difference equivalent to that in the current storage operation is generated between the gate and the source of the PMOS transistor M32 by the voltage component held in the storage capacitance C31, a drive control current Iac having a current value equivalent to that of the write current Iw (=the operating current Ic) flows down in a direction of the output junction N33 (current mirror circuit portion 32) from the high-potential power supply through the PMOS transistors M32 and M34.

As a result, the drive control current Iac inputted to the current mirror circuit portion 32 is converted into a drive current Idv having a current value corresponding to a predetermined current ratio stipulated by the current mirror circuit configuration, and supplied to each load LD through each output terminal Tout. Here, to the drive current Idv supplied from each current storage circuit 30A to each load LD is applied the high-level output enable signal EN from the control portion through the output control terminal Ten upon completion of the current output operation, and supply is stopped when the PMOS transistor M34 carries out the off operation.

(Drive Method of Current Drive Apparatus)

In the current drive apparatus having the above-described structure, in a current write period, the operating current Ic having a predetermined current value according to the drive state of each load is sequentially generated and outputted by the single current generation circuit 10A, and the switch changeover signal SR sequentially outputted from the shift register 20A is sequentially applied to the switch circuits 40A provided in accordance with the respective output terminals Tout in synchronization with the output timing of the operating current Ic. As a result, the switch circuits 40A sequentially perform the on operation with different timings synchronized with the output timing of the operating current Ic. The write current Iw corresponding to the operating current Ic outputted from the current generation circuit 10A sequentially flows down and is written in the current storage circuits 30A, and held as the voltage component (the above-described current storage operation). Sequentially, in the current output period, output of the switch changeover signal SR from the shift register 20A in the current write period is terminated, all the switch circuits 40A perform the off operation, and the operating current Ic according to the drive states of the loads is held in all the current storage circuits 30A. Thereafter, the output enable signal EN is applied to the respective current storage circuits 30A from the control portion in common with the same timing. As a result, the currents according to the voltage component held in the current storage circuits 30A are simultaneously supplied as the drive currents Idv to the loads through the output terminals Tout (the above-described current output operation).

By repeatedly setting such a current write period and current output period in accordance with a predetermined operating cycle, the loads can be caused to operate with a predetermined drive cycle.

Therefore, according to the current drive apparatus of this embodiment, the current storage circuits are individually provided to the single current generation circuit so as to correspond to a plurality of the output terminals, the current having a predetermined current value concerning the drive control over the loads is generated by the current generation circuit, and this current is sequentially stored in each current storage circuit with a predetermined timing. Then, the operating current supplied from the single current generation circuits can be held in accordance with respective output terminals by outputting the currents to the respective loads from the respective current storage circuits through the respective output terminals at the same time, and the drive current for each output terminal can be set based on the operating current. Therefore, the drive currents in which irregularities between the respective output terminals are suppressed can be supplied, thereby driving the respective loads with the uniform operating characteristic.

The element structure of the bipolar transistor or the MOS transistor applied to the current drive apparatus illustrated in this embodiment is not restricted, and it may be appropriately subjected to design change in accordance with the element characteristic, a manufacturing technique, a product cost and others.

Specifically, by sequentially repeating in accordance with each row the operation to supply the light emitting drive currents (drive currents) which have the uniform current characteristic and correspond to each display data from the individual current storage circuits to the light emitting elements (loads) each provided in accordance with each of the display pixels constituting the later-described display panel (see FIG. 15), it is possible to write the display data for one screen of the display panel into each display pixel and causes the light emitting operation with a predetermined brightness gradation, thereby enabling excellent display of desired image information while suppressing generation of display irregularities.

Here, the element structure of the bipolar transistor or the MOS transistor constituting the current storage circuit according to this embodiment is not particularly restricted, and it may be appropriately subjected to design change in accordance with the element characteristic, the product technique, the product cost and others. In particular, in the MOS transistor constituting the voltage component holding element, in order to obtain necessary operating speed, preferably, as described below, it is possible to excellently apply a transistor having the mobility μe of the MOS transistor being approximately 200 cm²/Vs or a larger value.

Figure 5A:
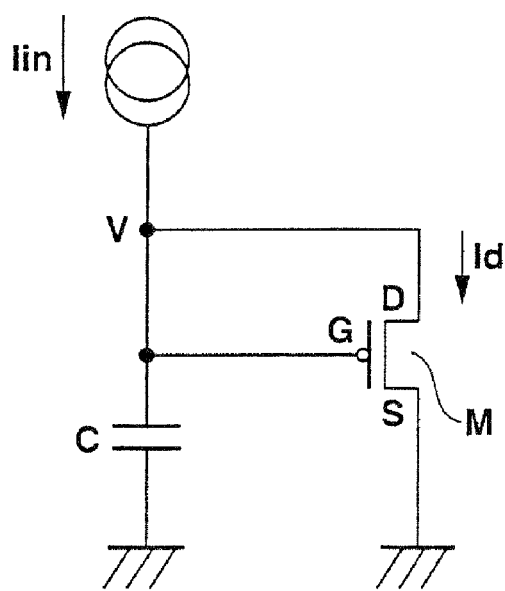
FIG. 5A is a view of an equivalent circuit showing a structure when an electric charge is accumulated in a capacitance between a gate and a source of a transistor.
Figure 5B:
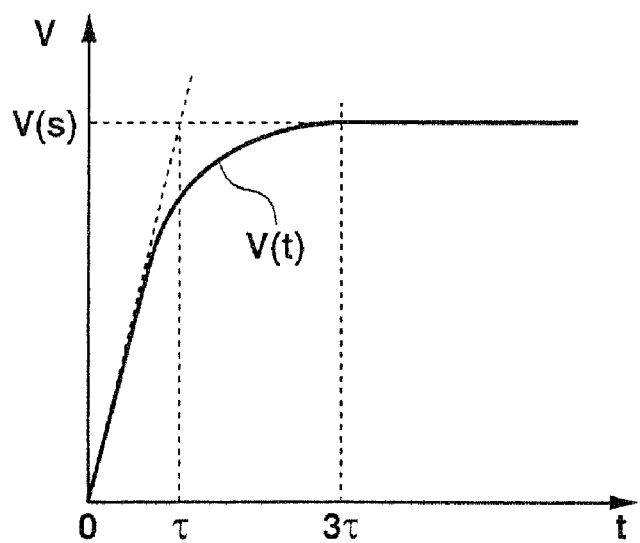
FIG. 5B is a graph showing an aged change in voltage of the capacitance when the electric charge is accumulated in the capacitance between the gate and the source of the transistor.

FIG. 5A shows an equivalent circuit of a structure when the electric charges are stored in the capacitance between the gate and the source of the transistor, and FIG. 5B is a graph showing an aged change in voltage of the capacitance when the electric charges are stored in the capacitance between the gate and the source of the transistor.

FIG. 5A corresponds to an equivalent circuit when predetermined electric charges are stored in the storage capacitance C31 in the voltage component holding portion 31 of the current storage circuit shown in FIG. 3, and corresponds to a case that the PMOS transistors M32 and M33 are ON and in the conductive state and the PMOS transistor M34 is OFF and in the open state. Here, the transistor M corresponds to the PMOS transistor M32, and the capacitance C corresponds to the storage capacitance C31 which is a sum total of a wiring capacitance, a storage capacitance and a gate capacitance of the transistor M. For the brief explanation, it is determined that the source S of the transistor M and one end of the capacitance C are set to a ground potential. FIG. 5B corresponds to a change of a time t relative to a drain voltage V(t) of the transistor M32, i.e., the voltage of the capacitance C31.

Here, as shown in FIG. 5A, when a current Iin is supplied to a drain D of the transistor M from a constant current source, assuming that V(t) is a drain voltage and Id is a drain current of the transistor M, the drain current Id can be represented by the following expression (1).

$$Id = A*V(t)^2 \quad (1)$$

wherein $A=(\frac{1}{2})*Cin*\mu e*(W/L)$, Cin is a gate capacitance per unit area of the transistor M, μe is the mobility of the transistor M, W is a channel width of the transistor M, and L is a channel length. Based on this, a differential equation of the following expression (2) can be established.

$$C*dV(t)/dt + AV(t)^2 = Iin \quad (2)$$

wherein the capacitance C is a sum total of the wiring capacitance, the storage capacitance, and the gate capacitance of the transistor M as described above. A change of the time t relative to the drain voltage V(t) of the transistor M, i.e., the voltage of the capacitance C obtained by solving the above expression is substantially as shown in FIG. 5B. Here, τ is a time constant, and it can be represented by the following expression (3) if the gate capacitance in the capacitance C is larger than any other capacitance. Further, with the time t=3τ, the voltage V(t) reaches a value which is 99.5% of a saturation voltage V(s).

$$\tau = C/\sqrt{A*Iin} \quad (3)$$

That is, the time constant τ is in proportion to a value of the capacitance C and in inverse proportion to the ½-th power of the mobility μe.

Here, assuming that a polysilicon TFT is used as the transistor M, the capacitance C is 6 pF, W/L is 100 μm/30 μm, the mobility μe is 70 m²/Vs, a film thickness of a gate insulating film is 105 nm and an application current Iin is 10 μA, a time constant τ becomes 1.42 μsec. Therefore, when the number of the scanning lines in the display panel to be driven is set to as 120, a selection period per scanning line is approximately 139 μsec and the number of the data lines in which data can be written within this time is approximately 32.

In relation to this, when the mobility μe of the transistor M is 245 m²/Vs under the above-described condition, the time constant τ is approximately 0.096 μsec. As a result, the number of the data lines in which data can be written within the selection period per scanning line in the display panel is approximately 482, and a ¼ VGA panel having the 120 scanning lines and the 160 (×RGB) data lines can be driven.

Alternatively, if the capacitance C is 0.51 pF even though the mobility μe remains as 70 m²/Vs, the time constant τ likewise becomes approximately 0.096 μsec, and the ¼ VGA panel can be driven like the above.

That is, in order to drive at least the ¼ VGA panel, the mobility μe of the transistor M must have a value of approximately 200 cm²/Vs or a larger value, or the capacitance C must have a value smaller than approximately 0.5 pF.

As described above, since the time constant τ is in proportion to a value of the capacitance C and in inverse proportion to the ½-th power of the mobility μe of the transistor, the time constant τ can be further decreased when the capacitance C is further reduced or the mobility μe is further increased, thereby driving the higher-definition display panel.

Although the structure of the transistor realizing the mobility or the capacitance value is not particularly restricted, for example, a polysilicon MOS transistor having a continuous grain boundary formed on an insulating substrate or an MOS transistor formed on a monocrystal silicon substrate can satisfy the above conditions, and it can be preferably used.

Second Embodiment of Current Drive Apparatus

Figure 6:
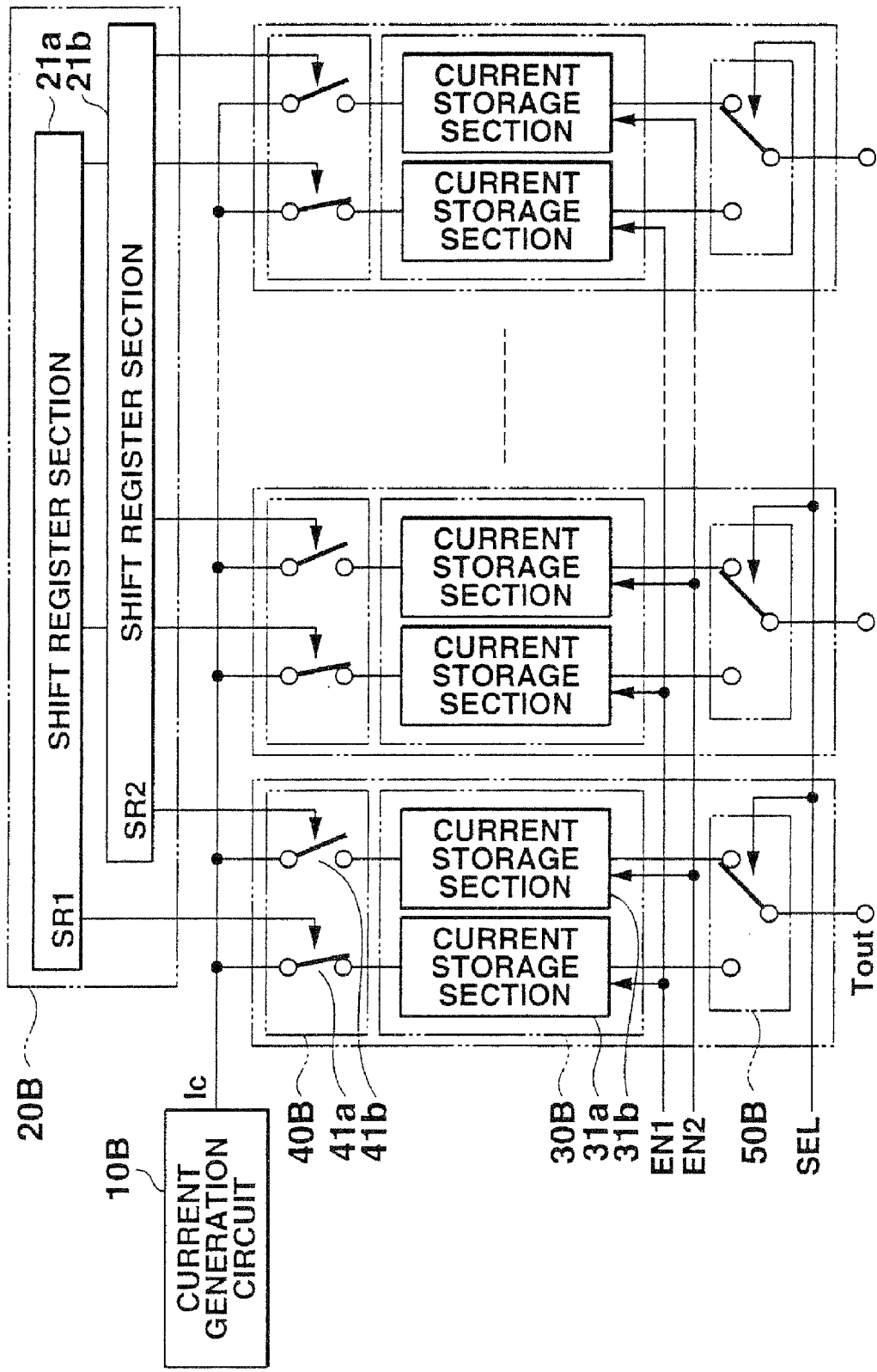
FIG. 6 is a primary structural view showing a second embodiment of a current drive apparatus according to the present invention.

FIG. 6 is a primary structural view showing a second embodiment of a current drive apparatus according to the present invention. Here, the same or equivalent reference numerals denote structures equivalent to those in the above-described first embodiment, thereby simplifying or eliminating their explanation.

The current drive apparatus according to the second embodiment includes a pair of current storage sections in accordance with an output terminal to which a load is connected, and is constituted to execute in parallel an operation to sequentially fetch a current having a predetermined current value supplied from a single current generation circuit by the current storage section on one side and hold a corresponding voltage component and operation to simultaneously output the current based on the voltage component which has been already held in the current storage section on the other side through the output terminal.

As shown in FIG. 6, the current drive apparatus according to this embodiment comprises: a single current generation circuit 10B which sequentially generates and outputs an operating current Ic having a predetermined value according to a drive stage of the load; a plurality of current storage circuits 30B each including a pair of current storage sections 31a and 31b which are provided as a pair in accordance with each output terminal Tout in parallel, alternately (selectively) fetch the operating current Ic supplied from the current generation circuit 10B with individual timings and hold a corresponding voltage component; a shift register 20B (shift register sections 21a and 21b) which is provided as a pair in accordance with the current storage sections 31a and 31b constituting the current storage circuit 30B and sets a timing when supplying the operating current Ic fed from the current generation circuit 10B to each of the current storage sections 31a and 31b; a plurality of input side switch circuits 40B having switches 41a and 41b which are provided as a pair in accordance with the current storage sections 31a and 31b constituting the current storage circuit 30B and control a supply state of the operating current Ic from the current generation circuit 10B to each current storage circuit 30B based on individual timings set by the respective shift register sections 21a and 21b; and a plurality of output side switch circuits 50B each of which is provided in accordance with each output terminal Tout, selects any of the current storage sections 31a and 31b based on a predetermined output selection signal SEL and controls an output stage of the current held in the current storage sections 31a and 31b to each output terminal Tout.

It is determined that the current generation circuit 10B, the shift register 20B (shift register sections 21a and 21b), the current storage circuit 30B (current storage sections 31a and 32b) and the input side switch circuit 40B (switches 41a and 41b) have the structures equivalent to those in the above-described first embodiment, thereby eliminating the detailed explanation.

Here, the first shift register section 21a sequentially outputs a shift output as a switch changeover signal SR1 with a predetermined timing to the first switch 41a provided in accordance with the first current storage section 31a in the current storage circuit 30B provided in accordance with each output terminal Tout. On the other hand, the second shift register section 21b sequentially outputs a shift output as a switch changeover signal SR2 with a timing which does not overlap the timing of the shift output from the shift register section 21a in time to the second switch 41b provided in accordance with the second current storage section 31b in the current storage circuit 30B provided in accordance with each output terminal Tout.

Furthermore, the output side switch circuit SOB is synchronized with the output timings of the switch changeover signals SR1 and SR2 from the shift register sections 21a and 21b based on an output selection signal SEL outputted from a non-illustrated control portion, and operates so as to select the current storage section (non-selected current storage section side) of the switch which is not performing the on operation in the input side switch circuit 40B.

In the current drive apparatus having such a structure, in a first operation period (a current write period on the first current storage section 31a side/a current output period on the second current storage section 31b side), when the switch changeover signal SR1 from the first shift register section 21a is sequentially outputted to each switch 41a provided in accordance with the current storage section 31a of each current storage circuit 30B, each switch 41a sequentially effects the on operation only in a predetermined period, and electric charges corresponding to an operating current Ic supplied from the current generation circuit 10B are sequentially written in each current storage section 31a as a voltage component. At this moment, the switch changeover signal SR2 is not outputted from the second shift register section 21b, and all the switches 41b are in the off state.

Moreover, at this moment, the output selection signal SEL which changes over and sets the output side switch circuit SOB provided in accordance with each output terminal Tout to the current storage section 31b side is outputted in common, and an output enable signal EN2 is outputted to all the current storage sections 31b with a predetermined timing in common. As a result, a current based on the electric charges which have been already held in each current storage section 31b is simultaneously outputted as a drive current Idv to each load through each output terminal Tout with the same timing.

Subsequently, in a second operation period (a current output period on the first current storage section 31a side/a current write period on the second current storage section 31b side) set after termination of the first operation period, when the switch changeover signal SR2 from the second shift register section 21b is sequentially outputted to each switch 41b provided in accordance with the current storage section 31b of each current storage circuit 30B, each switch 41b sequentially performs the on operation only in a predetermined period, and electric charges corresponding to the operating current Ic supplied from the current generation circuit 10B are sequentially written in each current storage section 31b as a voltage component. At this moment, the switch changeover signal SR1 is not outputted from the shift register section 21a, and all the switches 41a are in the off state.

Additionally, at this moment, the output selection signal SEL used to change over and set the output side switch circuit SOB to the current storage section 31a side is outputted from the control portion in common, and the output enable signal EN1 is outputted to all the current storage sections 31a with a predetermined timing in common. As a result, a current based on the electric charges held in each current storage section 31a in the first operation period is simultaneously outputted as the drive current Idv to each load through each output terminal Tout with the same timing.

By controlling such a first and second operation period so as to be repeated in accordance with a predetermined operation cycle, the operation to hold the electric charges corresponding to the operating current Ic outputted from the current generation circuit 10B in one of a pair of the current storage sections 31a and 31b, and the operation to output the current based on the electric charges held in the other current storage section as the drive current Idv are alternately executed in parallel.

Therefore, according to the current drive apparatus of this embodiment, like the above-described first embodiment, the operating current outputted from the single current generation circuit is sequentially fetched and held in each current storage circuit (current storage section), and outputted with a predetermined timing at the same time. As a result, the current with the uniform current characteristic supplied from the single current source can be held in accordance with each output terminal, and irregularities in the drive current between the respective output terminals can be suppressed. Further, a pair of the current storage sections are provided in accordance with each output terminal, and the operation to sequentially write the electric charges corresponding to the current outputted from the current generation circuit on one current storage section side and the operation to simultaneously output the current based on the electric charges held on the other current storage section side are executed in parallel. As a result, the waiting time for the current write operation to the current storage section can be reduced or eliminated, the supply time of the drive current to each load can be extended, and the drive state of each load can be finely controlled. Furthermore, the time to fetch the operating current into each current storage section and hold it can be prolonged, thereby stably carrying out the holding operation in the current storage section.

Third Embodiment of Current Drive Apparatus

Figure 7:
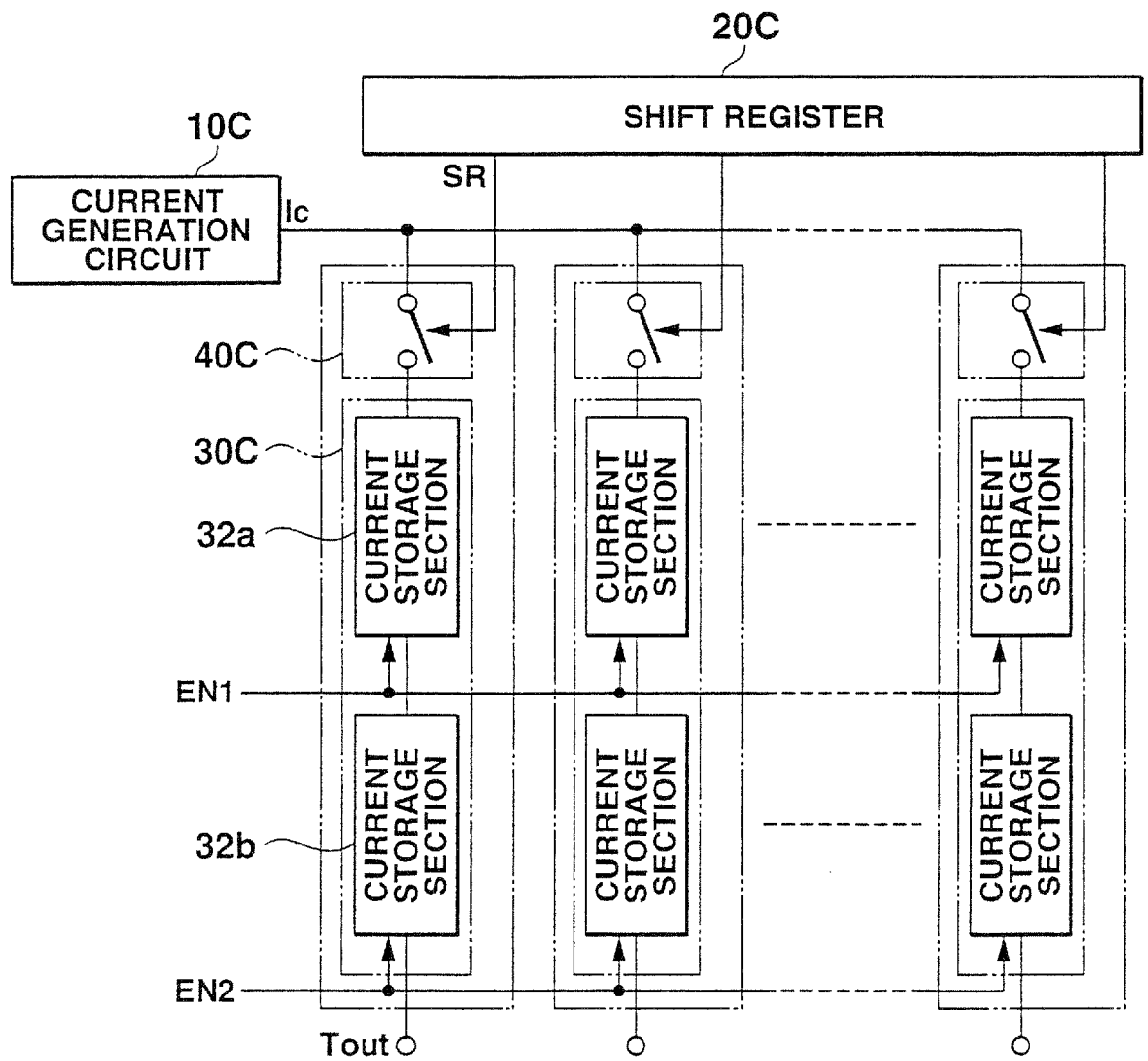
FIG. 7 is a primary structural view showing a third embodiment of a current drive apparatus according to the present invention.

FIG. 7 is a primary structural view showing a third embodiment of a current drive apparatus according to the present invention. Here, the same or equivalent reference numerals denote the structures equivalent to those in the first and second embodiments, thereby simplifying or eliminating their explanation.

The current drive apparatus according to the third embodiment has current storage sections on two stages provided in series in accordance with each output terminal to which a load is connected, and is constituted so as to execute an operation to sequentially hold a current having a predetermined current value supplied from a single current generation circuit by the current storage section on the front stage and an operation to hold the current supplied from the current storage section on the front stage by the current storage section on the rear stage and then collectively outputs it through the output terminal.

As shown in FIG. 7, the current drive apparatus according to this embodiment comprises: a single current generation circuit 10C which sequentially generates and outputs an operating current Ic having a predetermined current value according to a drive state of the load; a plurality of current storage circuits 30C each including a current storage section 32a on a front stage and a current storage section 32b on a rear stage provided in series in accordance with each output terminal Tout; a shift register 20C which sets a timing when supplying the operating current Ic fed from the current generation circuit 10C to the current storage section 32a on the front stage; and switch circuits 40C each of which controls a supply state of the operating current Ic from the current generation circuit 10C to each current storage circuit 30C. It is to be noted that the current generation circuit 10C, the shift register 20C, the current storage circuit 30C (current storage sections 32a and 32b) and the switch circuit 40C applied to this embodiment have the structures equivalent to, e.g., those in the above-described first embodiment, thereby eliminating their detailed explanation.

In each current storage circuit 30C, the operating current Ic supplied from the current generation circuit 10B is fetched into the current storage section 32a with a predetermined timing, a corresponding voltage component is held, and a current based on the held voltage component is supplied to the current storage section 32b on the rear stage with a predetermined timing based on a first output enable signal EN1 fed from a non-illustrated control portion or circuit. At this moment, the current storage section 32b on the rear stage fetches the current fed from the current storage section 32a on the front stage, holds a corresponding voltage component, and outputs a current based on the held voltage component through the output terminal Tout based on a second enable signal EN2 fed from the control portion.

In the current drive apparatus having such a structure, in a first operation period, a switch changeover signal SR from the shift register 20C is sequentially outputted to the switch circuit 40C provided in accordance with each current storage circuit 30C. As a result, the switch circuit 40C sequentially performs the on operation only in a predetermined period, and electric charges (voltage component) corresponding to an operating current Ic supplied from the current generation circuit 10C is sequentially written in the current storage section 32a on the front stage.

Furthermore, at this moment, when the second output enable signal EN2 is outputted from the control portion to all the current storage sections 32b on the rear stages in common with a predetermined timing, a current based on the electric charges which have been already held in each current storage section 32b is simultaneously outputted as a drive current Idv to each load through each output terminal Tout with the same timing.

Then, with a predetermined timing after completion of the first operation period, the first output enable signal EN1 is outputted from the control portion to all the current storage sections 32a on the front stage in common. As a result, the current held in each current storage section 32a in the first operation period is collectively supplied to the current storage section 32b on the rear stage and held (supply operation period).

Subsequently, in a second operation period set after completion of the supply operation of the current to the rear stage in the current storage circuit 30C, like the above-described first operation period, the switch changeover signal SR from the shift register 20C is again sequentially outputted to each switch circuit 40C. Consequently, the operating current Ic supplied from the current generation circuit 10C is sequentially written in the current storage section 32a on the front stage and, at this moment, the second output enable signal EN2 is outputted to the current storage section 32b on the rear stage in common with a predetermined timing. As a result, the current supplied from and held in each current storage section 32b is simultaneously outputted to each load as the drive current Idv.

By controlling such a series of operation periods so as to be repeated in accordance with a predetermined operation cycle, the operation to hold the electric charges corresponding to the operating current Ic outputted from the current generation circuit 10C in the current storage section 32a on the front stage, and the operation to output the current based on the current fed from the current storage section 32a on the front stage and supplied therefrom, from the current storage section 32b on the rear stage as the drive current Idv are executed in parallel.

Therefore, according to the current drive apparatus of this embodiment, like the above-described first embodiment, since the drive current of each output terminal is set based on the operating current fed from the single current generation circuit, irregularities in the drive current between the respective output terminals can be suppressed. Moreover, like the above-described second embodiment, the supply time of the drive current to each load can be prolonged, and the drive state of each load can be finely controlled. Additionally, the time to fetch the current into each current storage section and hold it can be extended, thereby stably executing the holding operation in the current storage section.

Fourth Embodiment of Current Drive Apparatus

Figure 8:
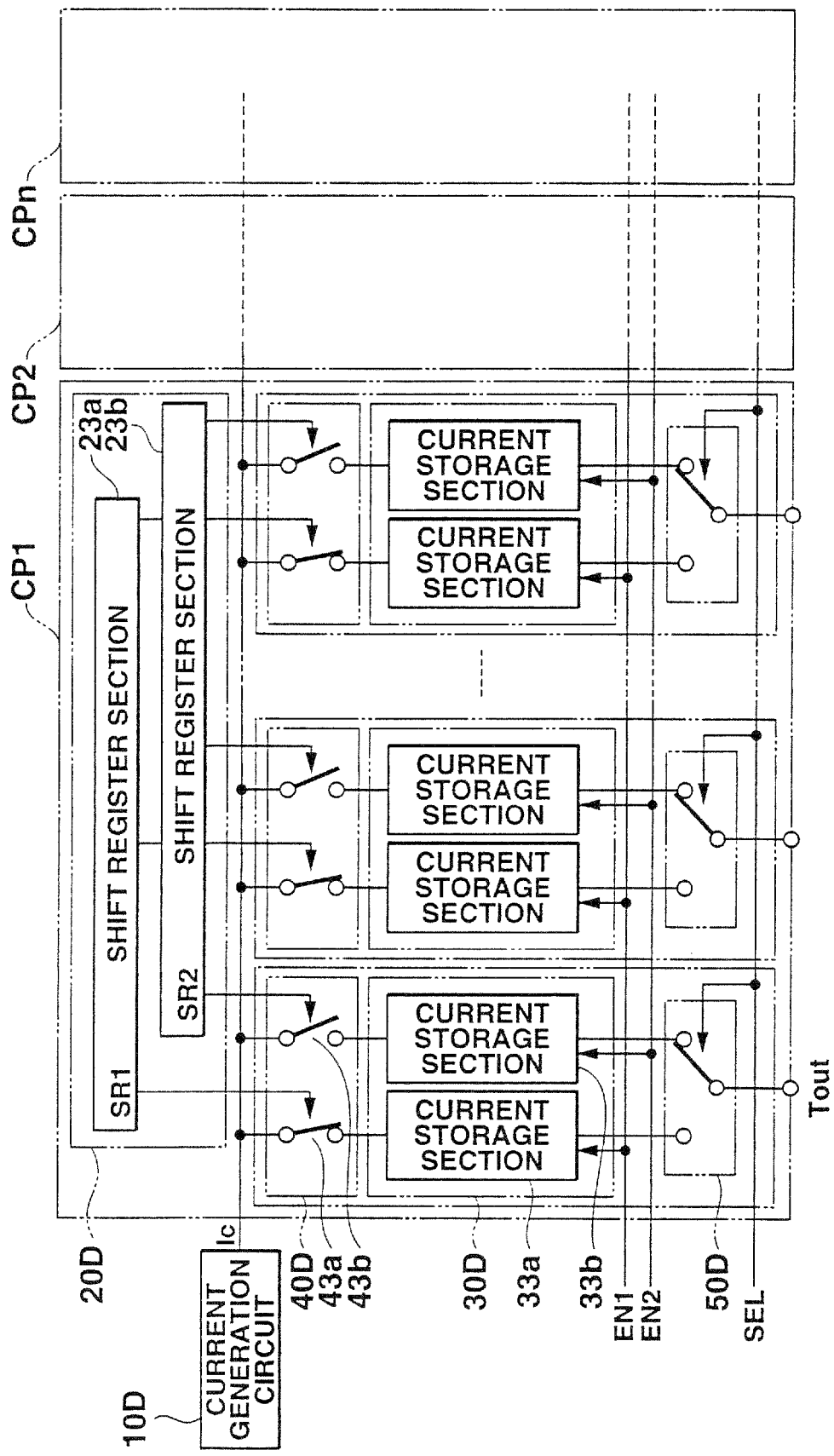
FIG. 8 is a primary structural view showing a fourth embodiment of a current drive apparatus according to the present invention.

FIG. 8 is a primary structural view showing a fourth embodiment of a current drive apparatus according to the present invention. Here, the same or equivalent reference numerals denote structures equivalent to those in the first to third embodiments mentioned above, thereby simplifying or eliminating their explanation.

In the structure described in conjunction with the first to third embodiments mentioned above, the current drive apparatus according to the fourth embodiment determines as one group a structure including the predetermined number of output terminals, current storage circuits provided in accordance with the output terminals, a shift register and switch circuits, forms each group on an individual semiconductor chip, provides a single current generation circuit with respect to each group (semiconductor chip), and supplies a current having a predetermined current value in common. It is to be noted that, in the following concrete example, although description will be given as to the case where the present invention is applied to the structure explained in conjunction with the second embodiment, but it can be similarly applied to any other embodiment.

As shown in FIG. 8, the current drive apparatus according to this embodiment comprises: a predetermined number of output terminals Tout equivalent to, e.g., the structure described in conjunction with the second embodiment (see FIG. 6); a plurality of current storage circuits 30D (current storage sections 33a and 33b) provided in accordance with the output terminals Tout; a shift register 20D (shift register sections 23a and 23b); a plurality of input side switch circuits 40D (switches 43a and 43b); a plurality of semiconductor chips CP1, CP2, . . . , CPn on which circuit configurations having a plurality of output side switch circuits SOD are respectively formed; and a single current generation circuit 10D which sequentially generates an operating current Ic having a predetermined current value according to a drive stage of a load connected to each output terminal Tout with respect to each of the semiconductor chips CP1, CP2, . . . , CPn and supplies it in common. Here, the current generation circuit 10D, the shift register 20D (shift register sections 23a and 23b), the current storage circuit 30D (current storage sections 33a and 33b), the current storage circuit 30D (current storage sections 33a and 33b), the input side switch circuit 40D (switches 43a and 43b) and the output side switch circuit SOD have the structures equivalent to, e.g., those in the second embodiment mentioned above, thereby eliminating their detailed explanation.

Here, the current generation circuit 10D may be formed on a specific semiconductor chip among a plurality of the semiconductor chips CP1, CP2, . . . CPn each having a circuit configuration including the current storage circuit 30D formed thereto. Alternatively, the same circuit may be formed on each of the semiconductor chips CP1, CP2, . . . CPn, and any one of them may be used to cause other semiconductor chips to enter non-operating state or to be bypassed. Further, the current generation circuit 10D may be formed on a semiconductor chip different from a plurality of the semiconductor chips CP1, CP2, . . . CPn.

It is good enough that each of the semiconductor chips CP1, CP2, . . . CPn applied to this embodiment is formed of a semiconductor material such as single crystal silicone, and its material is not restricted in particular.

In the current drive apparatus having such a structure, by executing the operation similar to that of the above-described second embodiment, the operating current Ic outputted from the current generation circuit 10D is supplied to the respective semiconductor chips CP1, CP2, . . . CPn in common, it is sequentially fetched into one of a pair of the current storage sections 33a and 33b in the current storage circuit 30D provided in accordance with each of the semiconductor chips CP1, CP2, . . . CPn, and a corresponding voltage component is held. Furthermore, a current based on the voltage component held in the other current storage section is simultaneously outputted to the corresponding load through the output terminal Tout of each of the respective semiconductor chips CP1, CP2, . . . CPn. These operations are alternately and continuously executed.

Therefore, according to the current drive apparatus of this embodiment, only the single current generation circuit is provided with respect to semiconductor chips, and individual current circuits are not provided in accordance with the respective semiconductor chips. Accordingly, the circuit configuration formed on each semiconductor chip can be simplified, and the number of terminals can be reduced, thereby achieving minimization of the apparatus scale or decrease in the product cost. Moreover, even if a plurality of semiconductor chips are provided in accordance with the number of the output terminals connected to the loads, since the current having the uniform current characteristic supplied from the single current source can be held in the current storage circuit in each semiconductor chip, irregularities in the drive current between the respective output terminals and between the respective semiconductor chips can be suppressed, thereby driving each load with the uniform operation characteristic.

Specifically, in the later-described display panel (see FIG. 15), even if the number of display pixels is increased in order to realize the high definition of the display image quality and/or a large screen of the display panel and the data driver is constituted by a plurality of driver chips (semiconductor chips), by sequentially repeating for each row the operation to sequentially supply a predetermined current according to display data outputted from the single current generation circuit to the current storage circuit formed on each driver chip and simultaneously supply the light emitting drive current (drive current) to each light emitting element with a predetermined timing, the display data for one screen of the display panel can be written in each display pixel and the light emitting operation can be performed with a predetermined brightness gradation. Therefore, image information of the high-definition and large-screen size can be excellently display while suppressing occurrence of display irregularities.

Fifth Embodiment of Current Drive Apparatus

Figure 9:
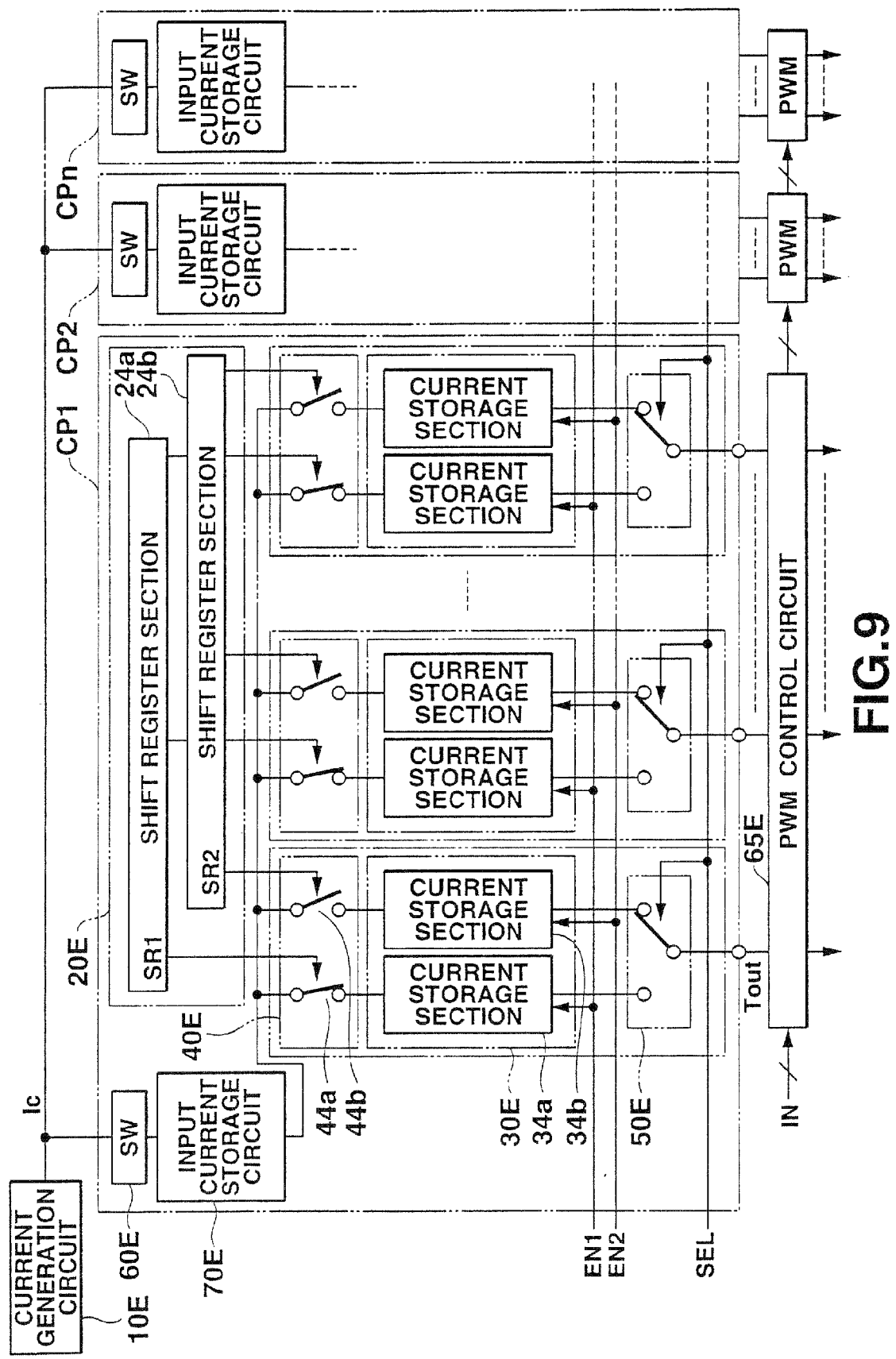
FIG. 9 is a primary structural view showing a fifth embodiment of a current drive apparatus according to the present invention.

FIG. 9 is a primary structural view showing a fifth embodiment of a current drive apparatus according to the present invention. Here, the same or equivalent reference numerals denote structures equivalent to those in the first to fourth embodiments mentioned above, thereby simplifying or eliminating their explanation.

The current drive apparatus according to this embodiment can be preferably applied to driving of, e.g., a simple matrix type display panel (see FIG. 2), and this can be applied to a drive mode which displays a desired image by performing a pulse width modulation (PWM) drive mode by supplying a current having a fixed current and set to a supply time (pulse width) according to display data from each output terminal to each display element (load).

The current drive apparatus according to this embodiment have a plurality of semiconductor chips, comprises a circuit configuration which is the same as one group including, e.g., the predetermined number of output terminals, current storage circuits provided in accordance with the output terminals, a shift register and switch circuits described according to the fourth embodiment, and has a structure that each single input current storage circuit is provided to an input portion of this circuit configuration. As a result, the operation to fetch a fixed current into the current storage circuit for each output terminal on the semiconductor chip can be simultaneously performed on the respectively semiconductor chips in parallel. In the following concrete example, although description will be given as to the case that the present invention is applied to a structure described in connection with the fourth embodiment, it can be likewise applied to any other embodiment.

As shown in FIG. 9, the current drive apparatus according to this embodiment includes a circuit configuration which is equivalent to, e.g., the structure described in conjunction with the fourth embodiment and have the predetermined number of output terminals Tout, a plurality of current storage circuits 30E (current storage sections 34a and 34b) provided in accordance with the output terminals Tout, a shift register 20E (shift register sections 24a and 24b), a plurality of input side switch circuits 40E (switches 44a and 44b), and a plurality of output side switch circuits 50E. Furthermore, this apparatus comprises: a plurality of semiconductor chips CP1, CP2, . . . CPn each having an input switch circuit 60E which performs the on/off operation based on a shift output (switch changeover signal) from a non-illustrated shift register or control portion being formed thereon on a front stage of the circuit configuration, i.e., at an input portion to which the operating current Ic outputted from the current generation circuit 10E is supplied and an input current storage circuit 70E which fetches and holds an operating current Ic outputted from a current generation circuit 10E; and the single current generation circuit 10E which supplies the predetermined operating current Ic to the respective semiconductor chips CP1, CP2, . . . CPn in common.

The current generation circuit 10E, the shift register 20E (shift register sections 24a and 24b), the current storage circuit 30E (current storage sections 34a and 34b), the input side switch circuit 40E (switches 44a and 44b) and the output side switch circuit 50E applied to this embodiment have the structures equivalent to those in the fourth embodiment mentioned above, thereby eliminating the detailed description.

Here, the input switch circuit 60E provided to each of the semiconductor switches CP1, CP2, . . . CPn performs the on operation based on a shift output (switch changeover signal) sequentially outputted from a non-illustrated shift register (or a control portion), sets the operating current Ic outputted from the current generation circuit 10E to the write state in order to feed this current to each of the semiconductor chips CP1, CP2, . . . CPn, and controls in such a manner that the operating current Ic is fetched into and held in the input current storage circuit 70E.

The input current storage circuit 70E has the structure equivalent to, e.g., that of the current storage circuit in the first embodiment mentioned above, fetches the operating current Ic outputted from the current generation circuit 10E with a predetermined timing that the input switch circuit 60E enters the on state, holds a corresponding voltage component, and outputs the operating current Ic based on the held voltage component to the current storage circuit 30E (any one of the current storage sections 34a and 34b) through the input side switch circuit 40E (any one of the switches 44a and 44b) in each semiconductor chip based on an output enable signal outputted from a non-illustrated control portion.

In the current drive apparatus having such a structure, the operating current Ic having a predetermined current value outputted from the current generation circuit 10E is supplied to each of the semiconductor chips CP1, CP2, . . . CPn in common, it is sequentially fetched into the input current storage circuit 70E through the input switch circuit 60E provided in accordance with each of the semiconductor chips CP1, CP2, . . . CPn with a predetermined timing, and a corresponding voltage component is held.

In a first operation period, a current based on the voltage component held in the input current storage circuit 70E is supplied to one storage section of the current storage circuit 30E (e.g., the first current storage section 34a) through one switch in the input side switch circuit 40E in common (e.g., the first switch 44a) in each of the semiconductor chips CP1, CP2, . . . CPn, and a corresponding voltage component is held. At this moment, a current based on the voltage component which has been already held in the other one storage section in the current storage circuit 30E (e.g., the second current storage section 34b) is simultaneously outputted as a drive current Idv to the respective output terminals Tout.

Subsequently, with a predetermined timing after completion of the first operation period, the operating current Ic outputted from the current generation circuit 10E is again sequentially fetched into and held in the input current storage circuit 70E through the input switch circuit 60E provided in accordance with each of the semiconductor chips CP1, CP2, . . . CPn with a predetermined timing.

Then, after completion of the first operation period, in a second operation period which is set after termination of the fetching and holding operation of the operating current Ic into the input current storage circuit 70E, like the above-described first operation period, the current based on the voltage component held in the input current storage circuit 70E is supplied to the other one storage section in the current storage circuit 30E (e.g., the current storage section 34b) through the other one switch in the input side switch circuit 40E (e.g., the switch 44b) in each of the semiconductor chips CP1, CP2, . . . CPn in parallel, and a corresponding voltage component is held. Furthermore, at this moment, the current based on the voltage component held in one storage section in the current storage circuit 30E (e.g., the current storage section 34a) in the first operation period is simultaneously outputted to the respective output terminals Tout as a drive current Idv.

By repeatedly setting such a series of the operation periods in accordance with a predetermined operation period, the operation to sequentially hold the operating current Ic outputted from the current generation circuit 10C in the input current storage circuit 70E in the input portion, supply it to the current storage circuit 30E on the rear stage and fetch it into one storage section in the current storage circuit 30E and the operation to output the current held in the other storage section as the drive current Idv to the respective output terminals Tout at same time are alternately and continuously executed.

Therefore, according to the current drive apparatus of this embodiment, a current outputted from the single current generation is sequentially fetched into the input current storage circuit provided in accordance with each semiconductor chip, it is then fetched into and held in the current storage circuit on the rear stage provided in accordance with each output terminal in parallel in each semiconductor chip, and it is collectively outputted with a predetermined timing. As a result, irregularities in the drive current between the respective output terminals can be suppressed, and the operation to fetch the current into the current storage circuit corresponding to the output terminal of each semiconductor chip can be performed between the respective semiconductor chips in parallel. Therefore, the time required to fetch and hold the current in each current storage circuit can be prolonged, thereby stably effecting the holding operation in the current storage section.

Here, in this embodiment, the operating current Ic fetched and held by the input current storage circuit 70E provided in accordance with each of the semiconductor chips CP1, CP2, . . . CPn is sequentially fetched into and held in a plurality of the current storage circuits 30E provided in the respective semiconductor chips CP1, CP2, . . . CPn, and it is outputted from the respective output terminals Tout at the same time with a predetermined timing. The drive current Idv supplied to each load through each output terminal Tout becomes a constant current having the same current value with each timing. Further, in order to perform driving of pulse width modulation (PWM) by using the current drive apparatus according to this embodiment, for example, as shown in FIG. 9, by adding a PWM control circuit 65E by which display data IN is supplied between each output terminal Tout and the display element (load) and an application time of the current to be supplied to each load is controlled in accordance with the display data, each load can be caused to operate by pulse width modulation (PWM). This PWM control circuit 65E may be integrally formed in each of the semiconductor chips CP1, CP2, . . . CPn, or it may be formed on a semiconductor chip different from the respective semiconductor chips so as to be electrically connected to the respective semiconductor chips CP1, CP2, . . . CPn.

That is, in a later-described simple matrix type display panel (see FIG. 20), by sequentially repeating for each row the operation to supply a light emitting drive current (drive current) having the uniform current characteristic and consisting of a constant current set to a supply time (pulse width) according to each display data from all of the respective output terminals of the driver chips (semiconductor chips) constituting the data driver with respect to the light emitting elements (loads) in a predetermined display period, the display data for one screen of the display panel can be written in each display pixel and the light emitting operation can be performed with a predetermined brightness gradation. Thus, desired image information can be excellently displayed while suppressing occurrence of display irregularities.

Sixth Embodiment of Current Drive Apparatus

Figure 10:
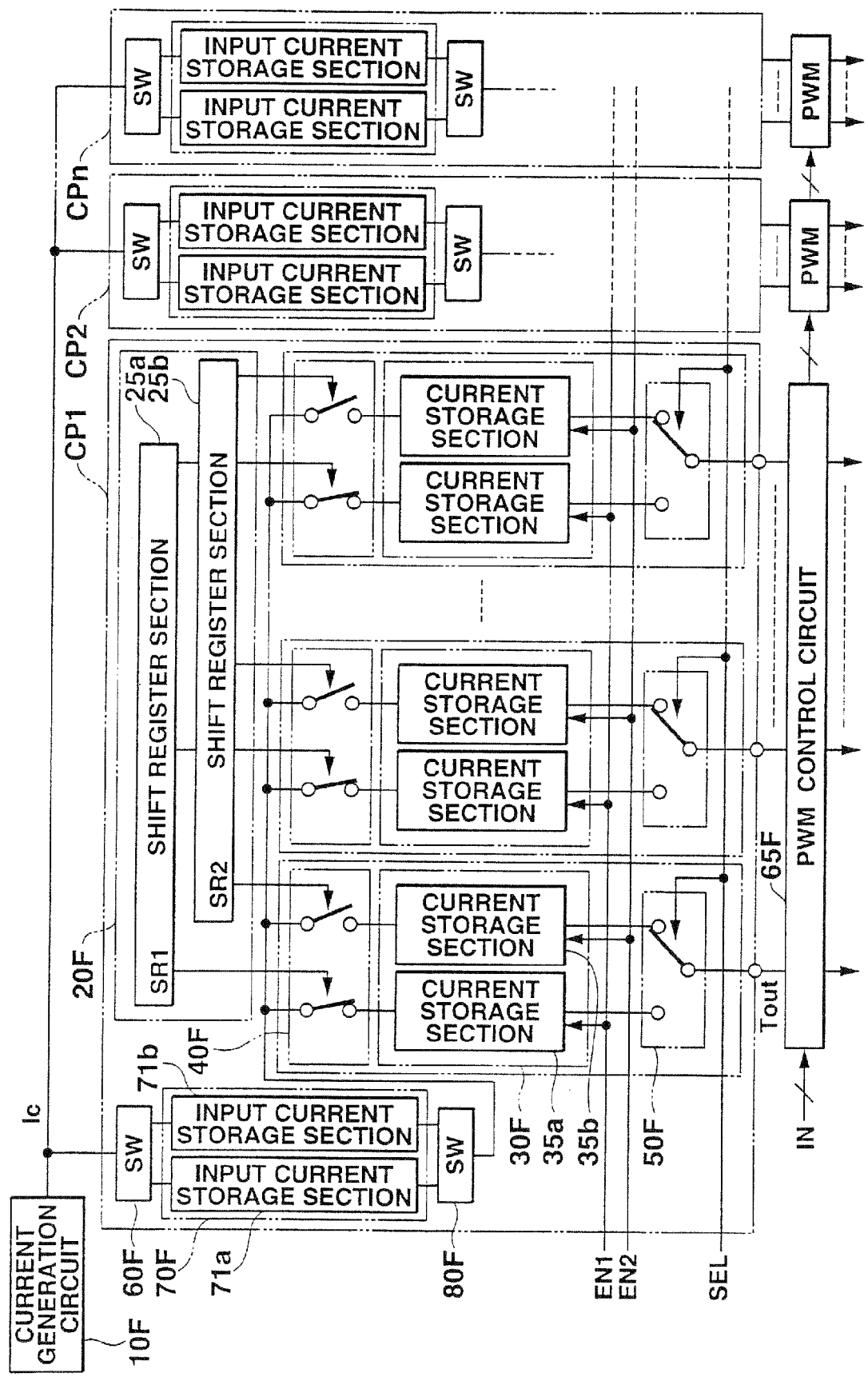
FIG. 10 is a primary structural view showing a sixth embodiment of a current drive apparatus according to the present invention.

FIG. 10 is a primary structural view showing a sixth embodiment of a current drive apparatus according to the present invention. Here, the same or equivalent reference numerals denote structures equivalent to those in the first to fifth embodiments mentioned above, thereby simplifying or eliminating their explanation.

In the structure described in conjunction with the above-described fifth embodiment, a current drive apparatus according to the sixth embodiment has a structure that an input current storage circuit provided in accordance with each semiconductor chip has a pair of current storage sections provided in parallel. In the following concrete example, although description will be given as to the case that the present invention is applied to the structure described in conjunction with the above fifth embodiment, but it can be likewise applied to any other embodiment.

Specifically, as shown in FIG. 10, in the structure of the fifth embodiment (see FIG. 9), the current drive apparatus according to this embodiment has a structure that an input current storage circuit 70F provided at an input portion of each of semiconductor chips CP1, CP2, . . . CPn includes a pair of current storage sections 71a and 71b arranged in parallel with each other and individual switch circuits 60F and 80F used to selectively connect one of the current storage sections 71a and 71b are provided on the input side and the output side of the input current storage circuit 70F. Any other structure applied to this embodiment has a structure equivalent to that of the fifth embodiment mentioned above, thereby eliminating the detailed structure.

In the current drive apparatus having such a structure, an operating current Ic outputted from the current generation circuit 10F is supplied to the respective semiconductor chips CP1, CP2, . . . CPn in common, and it is applied to the switch circuits 60F and 80F provided at the input portion of each of the semiconductor chips CP1, CP2, . . . CPn. As a result, the operation to sequentially fetch the operating current Ic into one of a pair of the current storage sections 71a and 72b of the current storage circuit 70F and hold a corresponding voltage component and the operation to supply the operating current Ic based on the voltage component which has been already held on the other side to a plurality of the current storage circuits 30F on the rear stages are alternately and continuously executed in parallel.

In a plurality of the current storage circuits 30F on the rear stages, the operation to sequentially fetch an operating current Ic fed from the input current storage circuit 70F into one of the current storage sections 35a and 35b with a predetermined timing and the operation to collectively output the current based on the voltage component held on the other side through the output terminal are alternately and continuously executed in parallel.

Therefore, according to the current drive apparatus of this embodiment, in the state that the current outputted from the single current generation circuit is sequentially written into one input current storage section of the input current storage circuit provided in accordance with each semiconductor chip, the current held in the other input current storage section is supplied to, fetched into and held in the current storage section provided in accordance with each output terminal. Thus, the time required to fetch and hold the current in each input current storage section can be prolonged, and the holding operation in the input current storage section can be stably carried out. Further, since the waiting time of the operation to write the current to each semiconductor chip can be reduced or eliminated, the supply time of the drive current to the load can be prolonged, thereby finely controlling the drive state.

In this embodiment, like the fifth embodiment mentioned above, the drive current Idv supplied to each load through each output terminal Tout becomes a constant current having the same current value with each timing. Further, like the fifth embodiment, by providing the PMW control circuit 60F, applying the pulse width modulation (PWM) drive mode and adjusting the supply time (pulse width) of the constant current to each load, each load can be operated in a desired drive state.

Seventh Embodiment of Current Drive Apparatus

Figure 11:
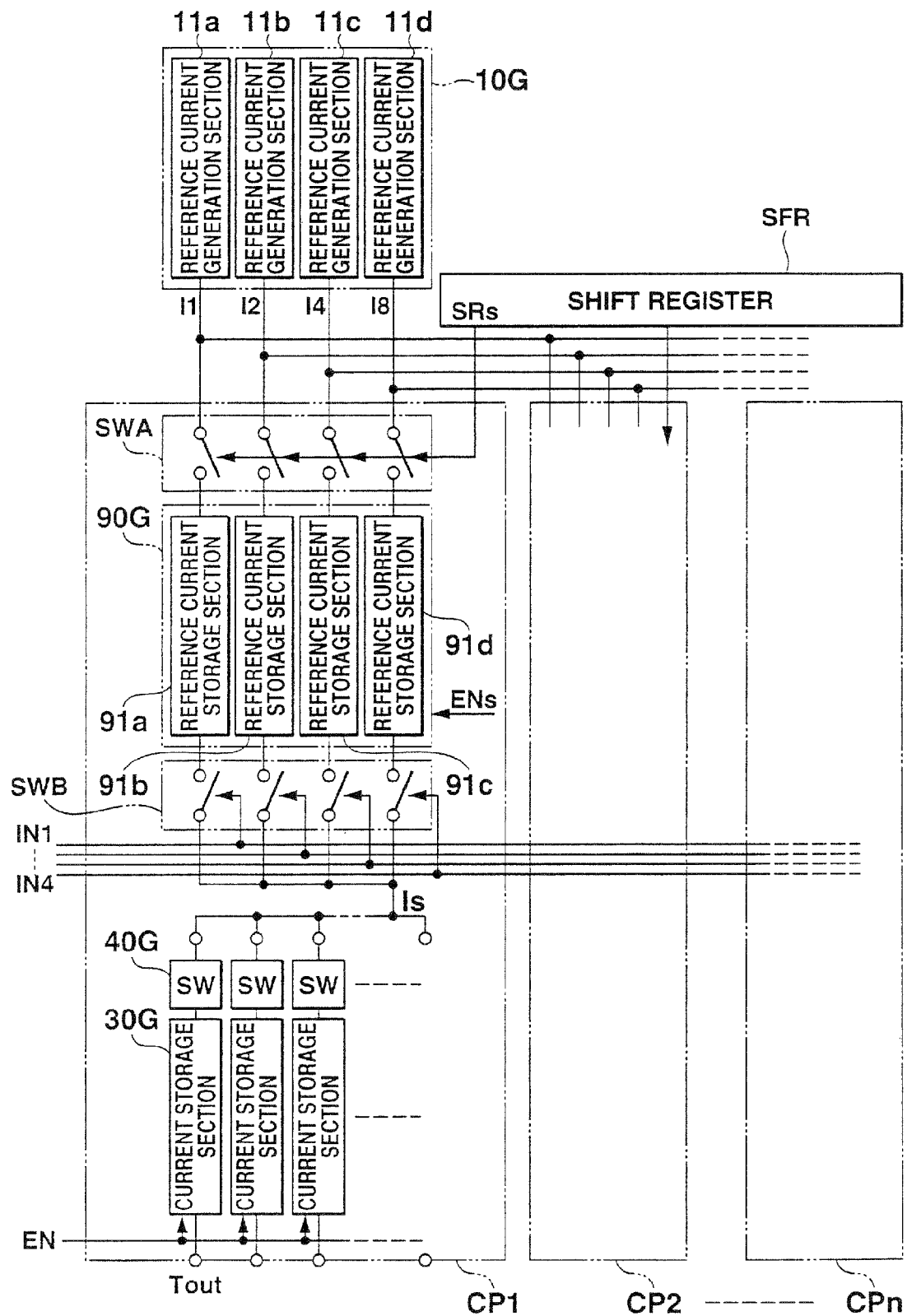
FIG. 11 is a primary structural view showing a seventh embodiment of a current drive apparatus according to the present invention.

FIG. 11 is a primary structural view showing a seventh embodiment of a current drive apparatus according to the present invention. Here, the same or equivalent reference numerals denote structures equivalent to those in the first to sixth embodiments, thereby simplifying or eliminating their explanation.

The current drive apparatus according to the seventh embodiment has a structure that a plurality of reference currents supplied from the single reference current generation circuit including a plurality of reference current generation sections which generate and output reference currents having current values set so as to have weightings different from each other are individually held in a plurality of the reference current storage sections provided in accordance with the reference currents and predetermined currents according to drive states of loads are sequentially generated based on the predetermined number of digital input signals.

As shown in FIG. 11, the current drive apparatus according to this embodiment comprises: a reference current generation circuit (reference current generation circuit) 10G including four reference current generation sections 11a to 11d which individually generate and output reference currents I1, I2, I4 and I8 to which weightings of, e.g., 1:2:4:8 are set; a shift register SFR which sets a timing when collectively supplying the respective reference currents I1, I2, I4 and I8 fed from the reference current generation circuit 10G to a reference current storage circuits 90G in parallel; the current storage circuits 90G each having a plurality of reference current storage sections 91a to 91d which individually fetch and hold reference currents I1, I2, I4 and I8 supplied from the reference current generation circuit 10G; input side switch circuits SWA each of which controls supply states of the reference currents I1, I2, I4 and I8 from the reference current generation circuit 10G (reference current generation sections 11a to 11d) to the reference current storage circuit 90G based on a timing set by a switch changeover signal (shift output) SRs outputted from the shift register SFR with a predetermined timing; output side switch circuits (gradation current generation circuits) SWB each of which selects an arbitrary reference current storage section in the reference current storage sections 91a to 91d constituting the reference current storage circuit 90G, combines (adds) the reference currents held in the selected reference current storage section and generates a current Is having a predetermined current value corresponding to a drive state of a load; a plurality of current storage circuits 30G which are provided in accordance with each output terminal Tout and fetch and hold the current Is generated by the output side switch circuit SWB with individual timings; and a plurality of switch circuits 40G which are provided in accordance with the current storage circuits 30G and control a supply state of the current Is from the output side switch circuit SWB to each current storage circuit 30G based on a timing set by a non-illustrated shift register (specifically, this is equivalent to the shift register shown in FIG. 1).

In this embodiment, the structure having the reference current generation circuit 10G, the reference current storage circuit 90G, the input side switch circuit SWA and the output side switch circuit SWB has a function as a current generation circuit which generates and outputs the current Is having a predetermined value according to a drive state of each load. The structure having the current storage circuits 30G and the switch circuits 40G has a function as a current storage circuit described in conjunction with the foregoing embodiments.

Here, in the current drive apparatus according to this embodiment, the structure including the predetermined number of the output terminals Tout, the current storage circuits 30G respectively provided in accordance with the output terminals Tout, the input side switch circuits 40G, the reference current storage circuit 90G which generates the predetermined current Is supplied to the current storage circuits 30G and the input side and output side switch circuits SWA and SWB is determined as each group, and each group is formed on each of the semiconductor chips CP1, CP2, ... CP2. Further, the single reference current generation circuit 10G is provided with respect to the groups (semiconductor chips) in such a manner that the reference currents I1, I2, I4 and I8 outputted from the reference current generation circuit 10G are supplied in common.

The reference current generation sections 11a to 11d have the circuit structure (see FIG. 2) equivalent to the current generation circuit described in accordance with the foregoing embodiments, and it is possible to apply a structure obtained by appropriately designing the circuit configuration in such a manner that a ratio of the current values of the reference currents generated by the reference current generation sections 11a to 11d becomes, e.g., 1:2:4:8. It is to be noted that the shift register SFR, the reference current storage circuits 90G (reference current storage section 91a to 91d) and the input side switch circuit SWA applied to this embodiment have the structures equivalent to those described in conjunction with the foregoing embodiments, thereby eliminating the detailed explanation.

In the current drive apparatus having such a structure, in a reference current generation period, the reference currents I1, I2, I4 and I8 to which the current values are set so as to have the weighting of 1:2:4:8 by the reference current generation sections 11a to 11d constituting the reference current generation circuit 10G are generated and outputted, and a switch changeover signal SRs sequentially outputted from the shift register SFR is sequentially applied to each input side switch circuit SWA. As a result, the switch circuit SWA sequentially performs the on operation with different timings only in a predetermined period, the reference currents I1, I2, I4 and I8 outputted from the reference current generation circuit 10G are simultaneously supplied to the reference current storage sections 91a to 91d, and corresponding voltage components are individually held in the respective reference current storage sections.

Subsequently, in a current output period, output of the switch changeover signal SRs from the shift register SFR is completed, all the input side switch circuits SWA execute the off operation, and the voltage components corresponding to the reference currents I1, I2, I4 and I8 are held in all the reference current storage circuits 90G. Thereafter, an output enable signal ENs is applied to the reference current storage sections 91a to 91d from a non-illustrated control portion or circuit in common, and digital input signals IN1 to IN4 are applied to the output side switch circuits SWB individually provided to the reference current storage sections 91a to 91d. As a result, for example, only the output side switch circuits SWB to which the high-level digital input signals IN1 to IN4 are applied perform the on-operation, the reference currents based on the held voltage components are selectively outputted, and these reference currents are combined (added). As a result, the currents Is having the current values according to the signal levels of the digital input signals IN1 to IN4 are generated.

Subsequently, in a current write period, the switch changeover signals SR from a non-illustrated shift register are sequentially outputted to the switch circuits 40G. As a result, the switch circuits 40G sequentially carry out the on operation only in a predetermined period, the currents Is supplied from the reference current storage circuit 90G through the output side switch circuit SWB are sequentially supplied and fetched into the current storage circuits 30G, and corresponding voltage components are held.

Then, in a drive current output period, the output enable signal EN is outputted from a non-illustrated control portion to all the current storage sections 30G with a predetermined timing in common, currents based on the voltage components held in the current storage circuits 30G are simultaneously outputted as drive currents Idv to the respective loads through the respective output terminals Tout with the same timing.

By repeatedly setting the reference current generation period, the current output period, the current write period and the drive current output period described above in accordance with a predetermined operation cycle, the loads can be operated in a predetermined drive cycle.

Therefore, according to the current drive apparatus of this embodiment, a plurality of the reference current storage sections in which the reference currents to which the current values are set so as to have weightings different from each other are arbitrarily selected based on the predetermined number of the digital input signals, and the reference currents held in the selected reference current storage sections are combined. In this manner, predetermined currents of the analog signals corresponding to the drive states of the loads are generated, the operation to hold the currents in the current storage circuits provided at the respective output terminals is sequentially executed, and the held currents are simultaneously supplied to the respective loads as the drive currents with a predetermined timing. As a result, each load can be operated in the drive state excellently corresponding to the input signal with a relatively simple apparatus structure. Furthermore, the reference currents having the uniform current characteristic outputted from the single current generation circuit are supplied to the reference current storage circuits provided in accordance with each semiconductor chip in common, and the drive currents are generated based on the reference currents. As a result, it is possible to excellently suppress irregularities in the drive currents between the semiconductor chips and between the output terminals provided to each semiconductor chip.

In this embodiment, although description has been given as to the case where the structure described in conjunction with the first embodiment is applied as the current storage circuit, it is possible to apply a structure that a plurality of the current storage sections explained with reference to the other embodiments are provided and the operation to sequentially fetch and hold the currents Is supplied from the reference current storage circuits and the operation to simultaneously output the held currents as the drive currents through the output terminals are alternately executed.

Specifically, in a later-described display panel (see FIG. 15), even if the number of the display pixels (light emitting elements; loads) is increased in order to realize a high definition of the display image quality and/or a large screen of the display panel and the data driver constructed by a plurality of the driver chips (semiconductor chips) is applied, the reference currents outputted from the single reference current generation circuit can be sequentially supplied to the respective driver chips, the light emitting drive currents (analog signals) having the current values excellently corresponding to display data (digital input signals) can be sequentially generated based on the reference currents and simultaneously supplied to the respective light emitting elements with a predetermined timing. Therefore, it is possible to realize the display apparatus which can excellently suppress irregularities in the light emitting drive currents between the respective output terminals and between the respective driver chips and perform multi-gradation display excellently corresponding to the display data while suppressing generation of display irregularities.

Eighth Embodiment of Current Drive Apparatus

Figure 12:
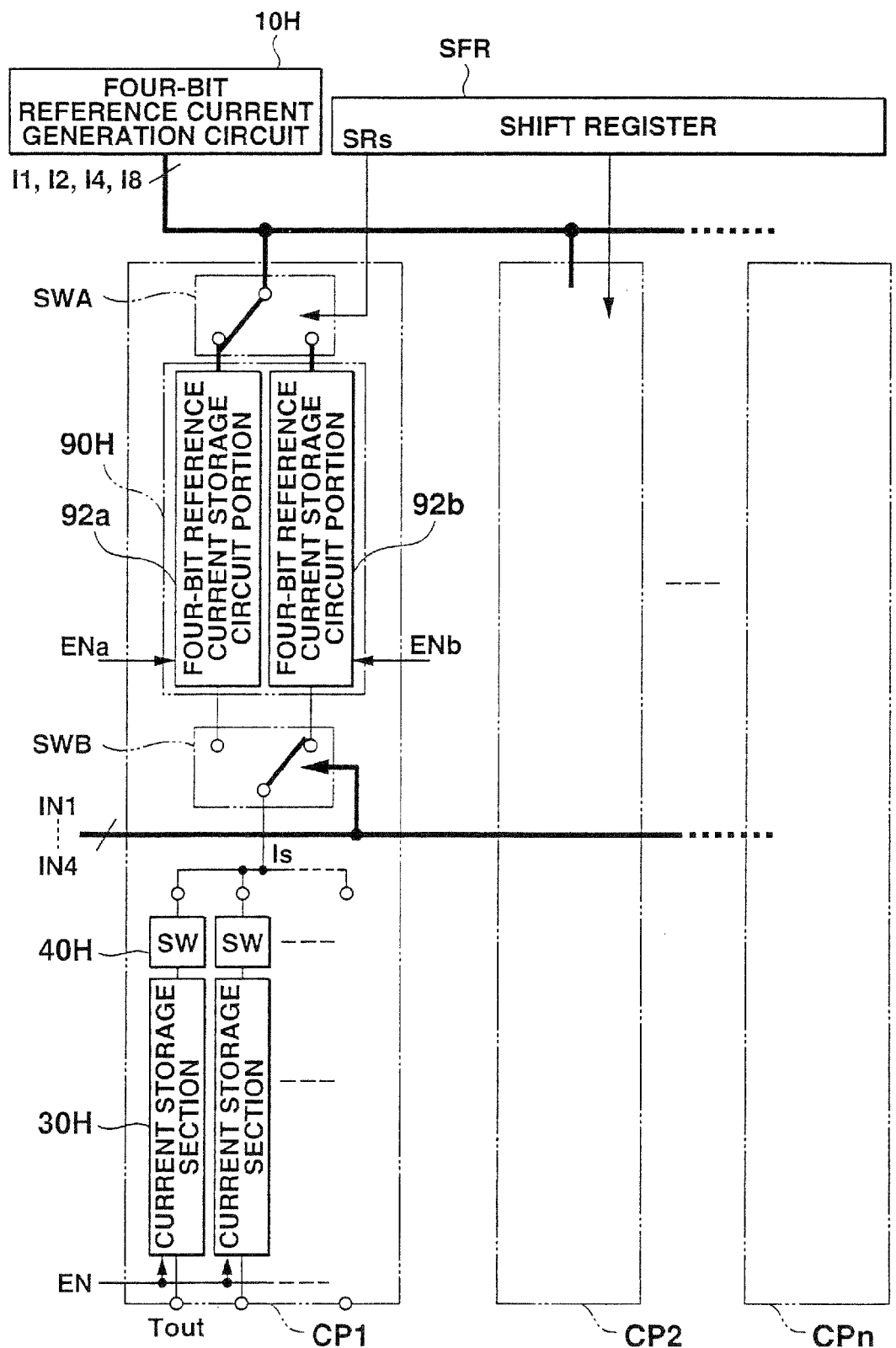
FIG. 12 is a primary structural view showing an eighth embodiment of a current drive apparatus according to the present invention.

FIG. 12 is a primary structural view showing an eighth embodiment of a current drive apparatus according to the present invention. Here, the same or equivalent reference numerals denote structures equivalent to those in the seventh embodiment mentioned above, thereby simplifying or eliminating their explanation.

In the structure described in connection with the seventh embodiment mentioned above, the current drive apparatus according to the eighth embodiment is configured to comprise in accordance with each semiconductor chip a pair of reference current storage circuit portions including a plurality of reference current storage sections which fetch and hold a plurality of reference currents outputted from the reference current generation circuit and alternately execute the operation to sequentially hold reference currents supplied from a single reference current generation circuit by a reference current storage circuit portion on one side and the operation to generate predetermined currents according to drive states of loads by a reference current storage circuit portion on the other side based on the reference currents which have been already held in parallel.

As shown in FIG. 12, in the structure described in connection with a seventh embodiment (see FIG. 11), the current drive apparatus according to this embodiment has a structure that a reference current storage circuit 90H provided to each of semiconductor chips CP1, CP2, . . . CPn comprises a pair of four-bit reference current storage circuit portions 92a and 92b (respective reference current storage circuit portions correspond to the reference current storage sections 91a to 91d shown in FIG. 11) arranged in parallel with each other and individual switch circuits SWA and SWB used to selectively connect to one of the four-bit reference current storage circuit portions 92a and 92b are provided on the input side and the output side of the reference current storage circuit 90H. Here, the four-bit reference current generation circuit 10H has, e.g., the same structure as those of the reference current generation sections 11a to 11d illustrated in FIG. 11, and a structure having four sets of reference current generation sections which generate and output the reference currents I1, I2, I4 and I8 to which current values are set so as to have weightings different from each other. It is to be noted that other structures applied to this embodiment have the structures equivalent to those in the seventh embodiment mentioned above, thereby eliminating the detailed explanation.

In the current drive apparatus having such a structure, reference currents I1, I2, I4 and I8 to which current values are set so as to have weightings different from each other are supplied from the four-bit current generation circuit 10H to the semiconductor chips CP1, CP2, . . . CPn in common, and switch changeover signals SRs sequentially outputted from the shift register SFR are sequentially applied to the input side switch circuit SWA. As a result, the reference currents are sequentially fetched into and individually held in one of a pair of the four-bit reference current storage circuit portions 92a and 92b of the reference current storage circuit 90H. At this moment, output enable signals ENa and ENb are applied to the four-bit reference current storage circuit on the other side from a non-illustrated control portion in common, and digital input signals IN1 to IN4 are applied to an output side switch circuit SWB. As a result, the operation by which the reference currents I1, I2, I4 and I8 which have been already held are selectively outputted, their current components are combined (added) and currents Is having current values according to signal levels of the digital input signals IN1 to IN4 are alternately and continuously executed.

Therefore, according to the current drive apparatus of this embodiment, in the state that the reference currents having different current values outputted from the single reference current generation circuit are sequentially written in one four-bit reference current storage circuit portion of the reference current storage circuit provided in accordance with each semiconductor chip, currents corresponding to the digital input signals are generated based on the reference currents held in the other four-bit reference current storage circuit portion, and they are sequentially outputted to the current storage sections on the rear stage. As a result, the time required to fetch and hold the currents in the respective reference current storage circuit portions can be prolonged, and the holding operation in the reference current storage circuit portion can be stably performed. Furthermore, since the waiting time in the operation to write the reference currents to the respective semiconductor chips can be reduced or eliminated, the supply time of the drive currents to the loads can be extended, thereby finely controlling the drive state.

Ninth Embodiment of Current Drive Apparatus

Figure 13:
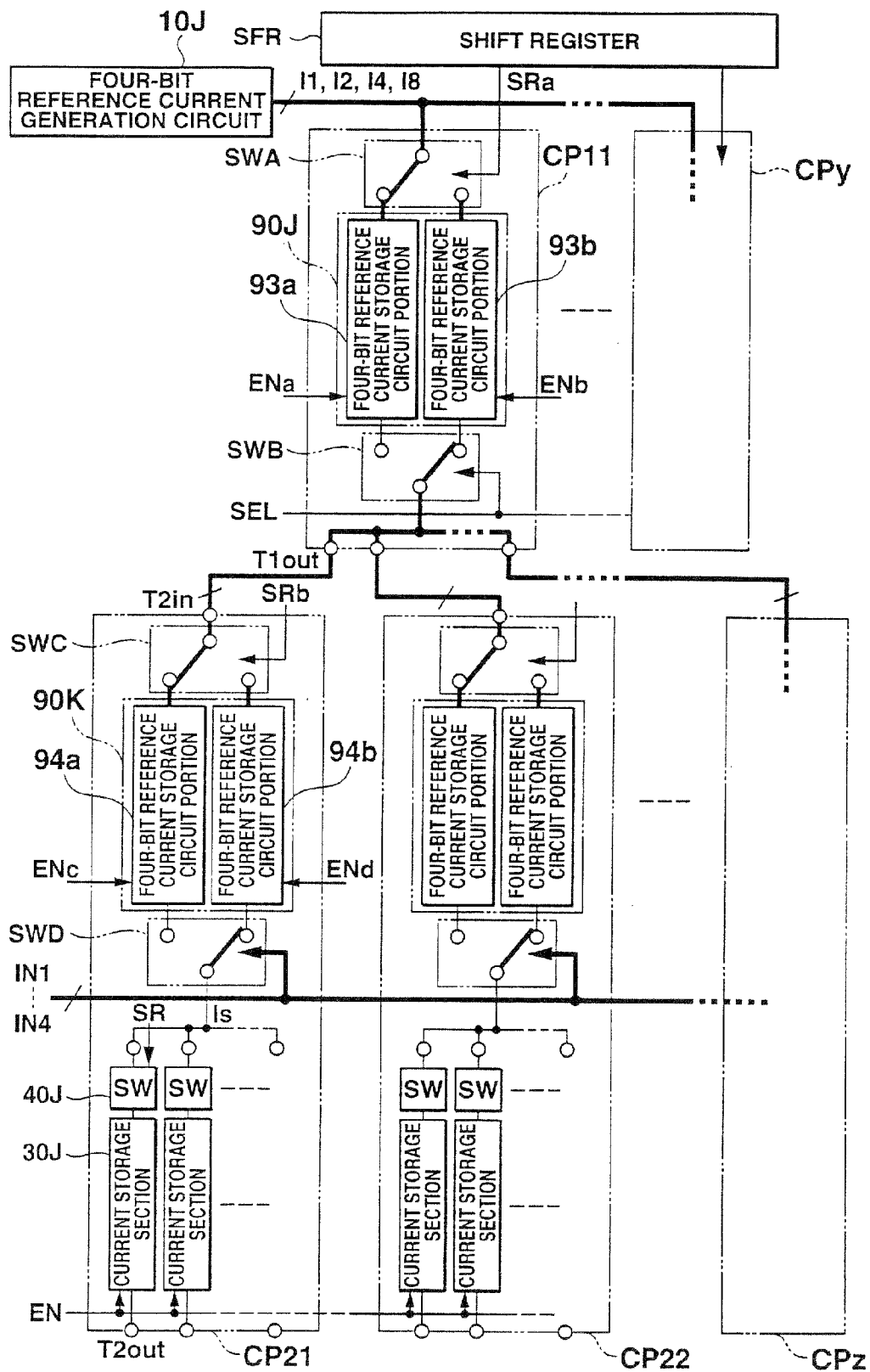
FIG. 13 is a primary structural view showing a ninth embodiment of a current drive apparatus according to the present invention.

FIG. 13 is a primary structural view showing a ninth embodiment of a current drive apparatus according to the present invention. Here, the same or equivalent reference numerals denote structures equal to those in the foregoing embodiments, thereby simplifying or eliminating their explanation.

The current drive apparatus according to a ninth embodiment has a structure that the structures which are applied to the current drive apparatuses according to the foregoing embodiments and formed to the semiconductor chips are stratified and a plurality of output terminals provided to an upper semiconductor chip are connected to input portions of a plurality of lower semiconductor chips. In the following concrete example, although description has been given as to the case that the present invention is applied to the structure described in connection with the eighth embodiment mentioned above, it can be likewise applied to any other embodiments.

As shown in FIG. 13, in the structure described in connection with the eighth embodiment (see FIG. 12), the current drive apparatus according to this embodiment comprises: upper semiconductor chips CP11, CP12, . . . CPy to which reference currents I1, I2, I4 and I8 to which current values are set so as to have weightings different from each other are supplied from a four-bit reference current generation circuit 10J in common; and lower semiconductor chips CP21, CP22, . . . CPz having input terminals T2in connected to a plurality of output terminals T1out according to the respective upper semiconductor chips CP11, CP12, . . . CPy. Output terminals T2out individually connected to a plurality of loads.

Here, each of the upper semiconductor chips CP11, CP12, . . . CPy comprises: a reference current storage circuit 90J including a pair of four-bit reference current storage circuit portions 93a and 93b; and individual switch circuits SWA and SWB used to selectively connect to one of the four-bit reference current storage circuit portions 93a and 93b. The operation to fetch and hold reference currents I1, I2, I4 and I8 fed from the four-bit reference current generation circuit 10J to one of four-bit reference current storage circuit portions (e.g., the first circuit portion 93a) with a predetermined timing based on a shift output (switch changeover signal) Sra from the shift register SFR and the operation which selectively executes the operation to supply the reference currents I1, I2, I4 and I8 held in the other four-bit reference current storage circuit portion (e.g., the second circuit 93b) to the lower semiconductor chips CP21, CP22, . . . CPz are alternately performed in parallel. That is, the semiconductor chips CP11, CP12, . . . CPy do not include the current generation circuit used to generate a current having a predetermined value based on an input signal or a current storage circuit on the rear stage such as shown in FIG. 12, and they are configured to output the held reference currents I1, I2, I4 and I8 and supply them to the lower semiconductor chips CP21, CP22, . . . CPz through the output terminal T1out and the input terminal T2in.

For example, like the above-described eighth embodiment, each of the lower semiconductor chips CP21, CP22, . . . CPz comprises: a reference current storage circuit 90K including a pair of four-bit reference current storage circuit portions 94a and 94b which fetch and hold reference currents I1, I2, I4 and I8 fed from the upper semiconductor chips CP11, CP12, . . . CPy with a predetermined timing based on a shift output (switch changeover signal) SRb from a non-illustrated shift register; an input side switch circuit SWC used to selectively connect to one of the four-bit reference current storage circuit portions 94a and 94b; an output side switch circuit SWD which selects arbitrary reference currents held in the four-bit reference current storage circuit portions 94a and 94b and generates currents having predetermined current values; and a current storage circuit 30J and a switch circuit 40J which sequentially fetch and hold the predetermined currents generated based on digital input signals IN1 to IN4 and simultaneously supply them to respective loads through output terminals T2out.

In the current drive apparatus having such a structure, reference currents I1, I2, I4 and I8 having current values whose weightings are different from each other are supplied from the four-bit reference current generation circuit 10J to the upper semiconductor chips CP1, CP12, . . . CPy in common, and the input side switch circuit SWA is switched to one of a pair of the four-bit reference current storage circuit portions 93a and 93b constituting the reference current storage circuit 90J. As a result, the reference currents I1, I2, I4 and I8 are individually fetched into and held in the four-bit reference current storage circuit portions, and the output side switch circuit SWB is switched to the other circuit portion in the reference current storage circuit 90J based on output enable signals ENa and Enb and a selection control signal SEL outputted from a non-illustrated control portion. As a result, the reference currents I1, I2, I4 and I8 which have been already held on the other side are supplied as they are to the input terminals T2in of the lower semiconductor chips CP21, CP22, . . . CPz through the respective output terminals T1out.

As to the reference currents I1, I2, I4 and I8 fed to the lower semiconductor chips CP21, CP22, . . . CPz, based on shift outputs SRb sequentially outputted from a non-illustrated shift register, the input side switch circuit SWC is switched to one of a pair of the four-bit reference current storage circuit portions 94a and 94b constituting the reference current storage circuit 90K. As a result, the reference currents I1, I2, I4 and I8 are individually fetched into and held in the four-bit reference current storage circuit portions. At the same time, the output side switch circuit SWD is switched to the other circuit portion in reference current storage circuit 90K based on the output enable signals ENc and End and the digital input signals IN1 to IN4, and arbitrary reference current storage sections are selected As a result, the reference currents I1, I2, I4 and I8 which have been already held on the other side are arbitrary selected and combined, and currents Is having predetermined current values according to drive states of the loads are generated and supplied to the current storage circuit 30J on the rear stage.

As to the currents Is fed to the current storage circuit 30J, the switch circuits 40J sequentially perform the on operation only in a predetermined period based on the shift output SR from the shift register, the currents Is fed from the reference current storage circuit 90K through the output side switch circuit SWO are sequentially written and held in the respective current storage sections 30J, and the output enable signal EN is applied from the control portion with a predetermined timing to drive the loads. As a result, the currents held in the respective current storage sections 30J are simultaneously outputted as the drive currents Idv to the respective loads via the respective output terminals T2out with the same timing.

Therefore, according to the current drive apparatus of this embodiment, the semiconductor chips each including the current storage circuit having a function to fetch predetermined currents and simultaneously output them with a predetermined timing are connected to each other so as to have a hierarchical structure. Therefore, by only supplying the predetermined currents or the reference currents to the small number of the upper semiconductor chips, the currents or the reference currents are sequentially supplied to a plurality of the lower semiconductor chips, and the predetermined drive currents are collectively supplied to the more loads through the respective output terminals. Thus, it is possible to suppress irregularities in the drive currents between the respective semiconductor chips and between the output terminals provided to the same semiconductor chip. Further, the time required to fetch and hold the predetermined current in each reference current storage circuit portion can be prolonged, thereby stably performing the holding operation in the reference current storage circuit portion. Furthermore, since the waiting time in the operation to write the reference current to each semiconductor chip can be further reduced or substantially eliminated, and the supply time of the drive currents to the loads can be extended, thereby finely controlling the drive states.

In this embodiment, since the structure obtained by applying the hierarchical structure to the above-described eighth embodiment has been described, the circuit configurations formed on the upper semiconductor chips CP11, CP12, ... CPy are different from those formed on the lower semiconductor chips CP21, CP22, ... CPy. However, for example, when applied to the structure described in conjunction with the first embodiment or the fourth embodiment, it is possible to apply the semiconductor chips having the same circuit configuration.

Embodiment of Display Apparatus

Description will now be given as to a case that the above-described current drive apparatus is applied to a display drive circuit of a display apparatus with reference to the accompanying drawings.

Figure 14:
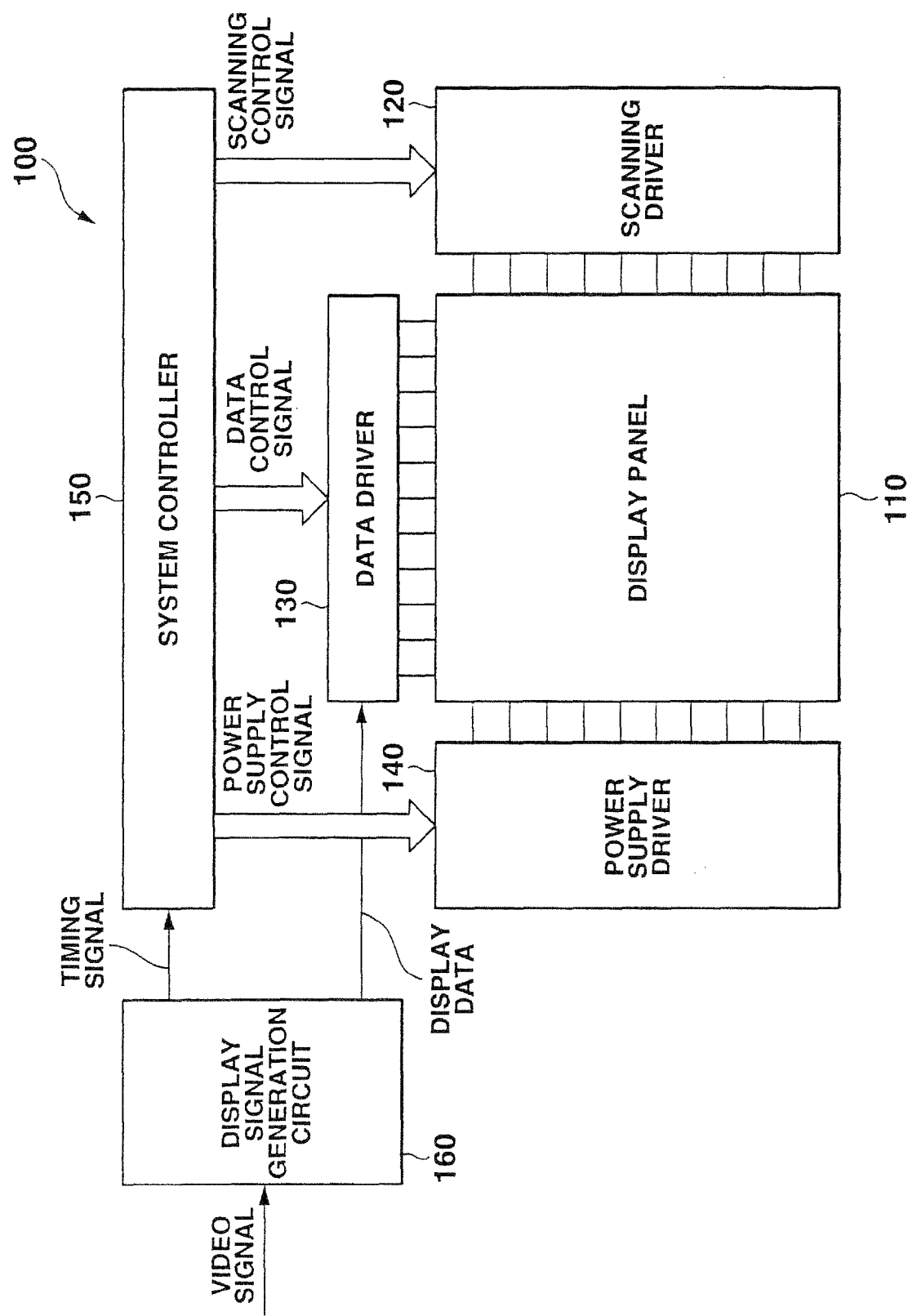
FIG. 14 is a schematic structural view showing an example of an entire structure of a display apparatus according to the present invention.
Figure 15:
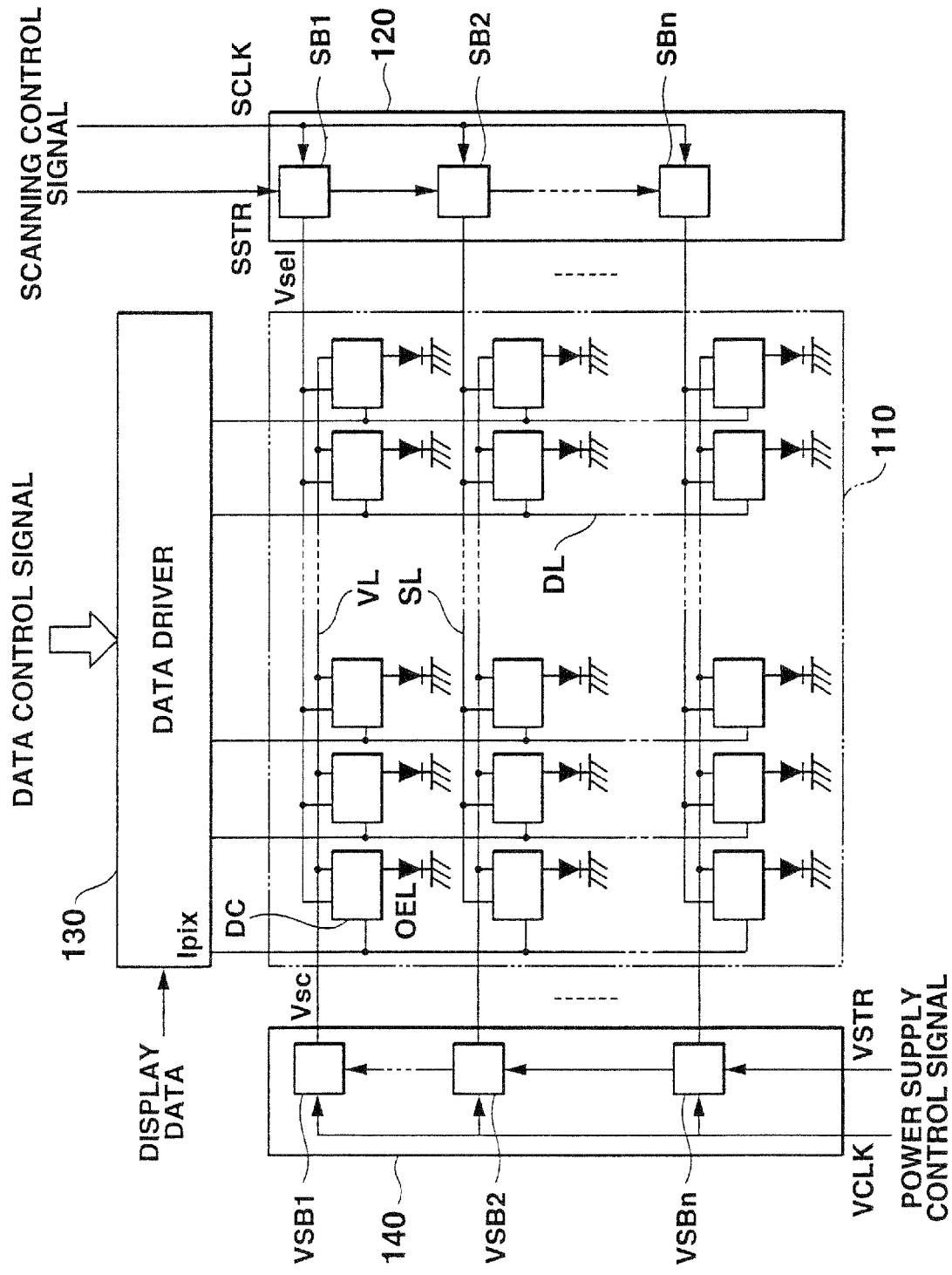
FIG. 15 is a block diagram showing a primary structure of a data driver, a scanning driver and a display panel applied to the display apparatus according to the embodiment.
Figure 16:
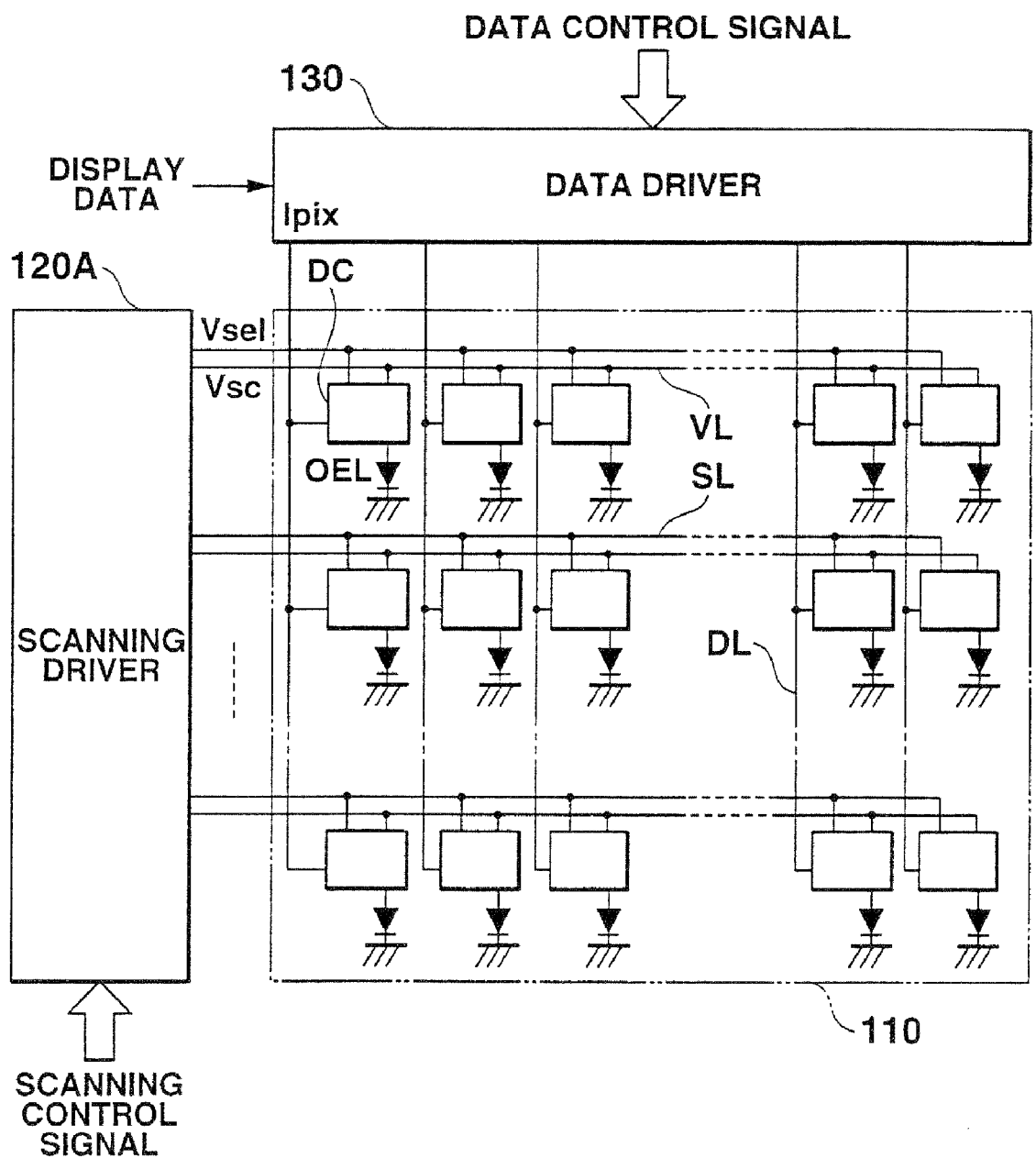
FIG. 16 is a schematic structural view showing another example of a scanning driver applied to the display apparatus according to the present invention.

FIG. 14 is a schematic block diagram showing an example of an entire structure of a display apparatus according to the present invention, FIG. 15 is a block diagram showing primary structures of a data drive and a display panel applied to the display apparatus according to this embodiment, and FIG. 16 is a schematic structural view showing another example of a scanning driver applied to the display apparatus according to the present invention.

As shown in FIG. 14, a display apparatus 100 according to this embodiment comprises: a display panel (pixel array) 110 in which later-described pixel drive circuits DC and a plurality of display pixels consisting of light emitting elements (optical elements: e.g., organic EL elements OEL) are arranged in a matrix form in the vicinity of intersections of a plurality of scanning lines SL as well as power supply liens VL arranged so as to be parallel to each other and a plurality of data lines DL, as schematically shown in FIG. 15; a scanning driver (scanning drive circuit) 120 which is connected to the scanning lines SL and controls a display pixel group for each row into a selected state by sequentially applying a high-level scanning signal Vsel to the scanning lines SL with a predetermined timing; a data driver (signal drive circuit) 130 which is connected to the data lines DL and controls a supply state of a signal current (gradation current Ipix) according to display data to the data lines DL; a power supply driver (power supply drive circuit) 140 which is connected to the power supply lines VL arranged in parallel with the scanning lines SL and causes a predetermined signal current (gradation current, drive current) according to the display data to flow to the display pixel group by sequentially applying a high-level or low-level power supply voltage Vsc to the power supply lines Vsc to the display pixel group; a system controller 150 which generates and outputs a scanning control signal, a data control signal and a power supply control signal which control operating states of at least the scanning driver 120, the data driver 130 and the power supply driver 140 based on a timing signal fed from a later-described display signal generation circuit 160; and a display signal generation circuit 160 which generates display data based on a video signal fed from the outside of the display apparatus 100 and supplies it to a data driver 130, and generates or extracts a timing signal (system clock and the like) used to display an image of the display data in the display panel 110 and supplies it to the system controller 150.

Each of the above structures will now be concretely described hereinafter.

(Display Panel)

As shown in FIG. 15, each of the display pixels arranged on the display panel in the matrix form has a pixel drive circuit DC which controls the later-described write operation to the display pixel and the light emitting operation of the light emitting element based on a scanning signal Vsel applied from the scanning driver 120 to the scanning line SL, a signal current supplied from the data driver 130 to the data line DL and a power supply voltage Vsc applied from the power supply driver 140 to the power supply line VL, and a light emitting element (organic EL elements OEL) whose light emitting brightness is controlled in accordance with a current value of a drive current supplied thereto.

The pixel drive circuit DC generally has a function to control the selection/non-selection state of the display pixel based on the scanning signal, fetch the gradation current according to the display data in the selection state and hold it as a voltage level, and apply the drive current according to the held voltage level in the non-selection state and maintain the operation of causing light emission of the light emitting elements in a predetermined period.

A concrete circuit example or a circuit operation of the pixel drive circuit will be described later. Moreover, in the display apparatus according to the present invention, as the light emitting element which is subjected to light emission control by the pixel drive circuit, it is not restricted to the organic EL element, and it is possible to excellently apply a self-luminous type light emitting element (optical elements) such as an inorganic EL element or light emitting diode.

(Scanning Driver)

The scanning driver 120 controls so as to write a gradation current Ipix based on display data supplied from the data driver 130 through the data lines DL into the display pixels with the display pixels being in the selection state by sequentially applying the high-level scanning signals Vsel to the respective scanning lines SL based on a scanning control signal supplied from the system controller 150.

Specifically, as shown in FIG. 15, the scanning driver 120 comprises shift blocks SB1, SB2, ... SBn on a plurality of stages shift registers and buffers in accordance with the respective scanning lines SL, and shift outputs generated while being sequentially shifted from the upper part to the lower part of the display panel 110 by the shift registers based on scanning control signals (a scanning start signal SSTR, a scanning clock signal SCLK and others) fed from the system controller are applied to the respective scanning lines SL as scanning signals Vsel having a predetermined voltage level (high-level) through the buffers.

(Data Driver)

The data driver 130 fetches and holds the display data supplied from the display signal generation circuit 160 with a predetermined timing based on various kinds of data control signals (an output enable signal OE, a data latch signal STB, a sampling start signal STR, a shift clock signal CLK and others) fed from the system controller 150, converts a gradation voltage (digital input signal) corresponding to the display data into a current component, and supplies it as a gradation current Ipix (analog output signal) to the respective data lines DL with a predetermined timing.

Specifically, to the data driver 130 can be applied any of the structures of the current drive apparatuses described in conjunction with the first to fourth or seventh to ninth embodiments.

Concretely, in case of applying the current drive apparatuses described in connection with the first to fourth embodiments, based on the display data of, e.g., digital signals generated based on a video signal by the display signal generation circuit, predetermined currents according to a brightness gradation of the light emitting elements in a single current generation circuit are generated, and the currents are sequentially fetched into and held in the respective current storage circuits corresponding to a plurality of the output terminals provided to the respective driver chips. Thereafter, the held currents are simultaneously outputted as gradation currents (drive currents) to the respective data lines provided to the display panel through the respective output terminals with a predetermined timing.

Additionally, in case of applying the current drive apparatuses described in conjunction with the seventh to ninth embodiments, a plurality of reference currents generated with current values being weighted in advance by the single reference current generation circuit are individually fetched into and held in the reference current storage circuits provided to the respective driver chips, and currents obtained by selecting and combining arbitrary reference currents based on the display data consisting of the digital signals are simultaneously outputted to the respective data lines provided to the display panel through the respective output terminals as the gradation currents (drive currents) corresponding to the brightness gradation of the light emitting elements.

In the current drive apparatus according to each of the foregoing embodiments, since the current components having the negative polarity are supplied to the data lines as the gradation currents, the currents corresponding to the gradation currents flow so as to be pulled in a data driver (current drive apparatus) direction via the output terminals from the data line (display panel) side. Therefore, the display apparatus according to this embodiment can be excellently applied to the display panel having the structure that the later-described current write type pixel drive circuit is provided to each display pixel to which the light emitting element is arranged.

(System Controller)

The system controller 150 operates each driver with a predetermined timing by respectively outputting a scanning control signal and a data control signal which control the operation state (the above-described scanning shift start signal SSTR or the scanning clock signal SCLK, the shift start signal STR or the shift clock signal CLK, the latch signal STB, the output enable signal OE, and others) to the scanning driver 120, the data driver 130 and the power supply driver 140, causes it to generate and output a scanning signal Vsel, a gradation current Ipix, a power supply voltage Vsc, executes a drive control operation in the later-described drive circuit, and controls the display panel 110 to display image information based on a predetermined video signal. The system controller 150 constitutes the control portion described in conjunction of the current drive apparatus concerning each of the foregoing embodiments.

(Power Supply Driver)

The power supply driver 140 pulls a write current (sink current) corresponding to the gradation current Ipix based on the display data in the data driver 130 direction via the display pixels (pixel drive circuit) from the power supply lines VL by applying the low-level power supply voltage Vscl (e.g., a voltage level equal to or below a ground potential) to the power supply lines VL in synchronization with a timing that the display pixel group for each row is set to the selection state by the scanning driver 120 based on the power supply control signal fed from the system controller 150. Further, this power supply driver 140 causes a drive current corresponding to the gradation current Ipix based on the display data to flow in the organic EL element OEL direction from the power supply liens VL via the display pixels (pixel drive circuits) by applying a high-level power supply voltage Vsch to the power supply lines VL in synchronization with a timing that the display pixel group for each row is set to the non-selection state by the scanning driver 120.

As shown in FIG. 15, the power supply driver 140 generally comprises voltage shift blocks VSB1, VSB2, ... VSBn on a plurality of stages consisting of shift registers and buffers in accordance with each power supply line VL like the shift blocks SB1, SB2, ... SBn of the above-described driver 120. Shift outputs generated while being sequentially shifted from the upper part toward the lower part of the display panel 110 based on power supply control signals (a power supply start signal VSTR, a power supply clock signal VCLK and others) synchronized with the scanning control signals fed from the system controller are applied to the respective power supply lines VL as power supply voltages Vscl and Vsch having a predetermined voltage level (a low level in the selection state set by the scanning driver and a high level in the non-selection state set by the same) through the buffers.

(Display Signal Generation Circuit)

The display signal generation circuit 160 extracts a brightness gradation signal component from, e.g., a video signal supplied from the outside of the display apparatus, and supplies it to the data driver 130 as display data for each line of the display panel 110. In cases where the video signal includes a timing signal component which stipulates a display timing of image information like a TV broadcasting signal (composite video signal), the display signal generation circuit 160 may have a function to extract the timing signal component and supply it to the system controller 150 as well as a function to extract the brightness gradation signal component. In this case, the system controller 150 generates the scanning control signal, the data control signal and the power supply control signal which are supplied to the scanning driver 120, the data driver 130 and the power supply driver 140 based on the timing signal fed from the display signal generation circuit 160.

In this embodiment, as shown in FIGS. 14 and 15, as the driver assembly attached to the circumference of the display panel 110, description has been given as to the structure in which the data driver 130 and the power supply driver 140 are individually arranged, but the present invention is not restricted thereto. As described above, since the scanning driver 120 and the power supply driver 140 operate based on the equivalent control signals (the scanning control signal and the power supply control signal) with which the timing is synchronized, it is possible to adopt, e.g., a structure that the scanning driver 120A has a function to supply the power supply voltage Vsc in synchronization with generation and output timings of the scanning signal as shown in FIG. 16. According to such a structure, the structures of the peripheral circuits can be simplified.

(Display Pixel: Pixel Drive Circuit)

A concrete example of a pixel drive circuit applied to the display pixel mentioned above will now be described with reference to the accompanying drawings.

First, description will be given as to a basic structure of a pixel drive circuit which can be applied to the display apparatus according to this embodiment and its operation.

Figure 18A:
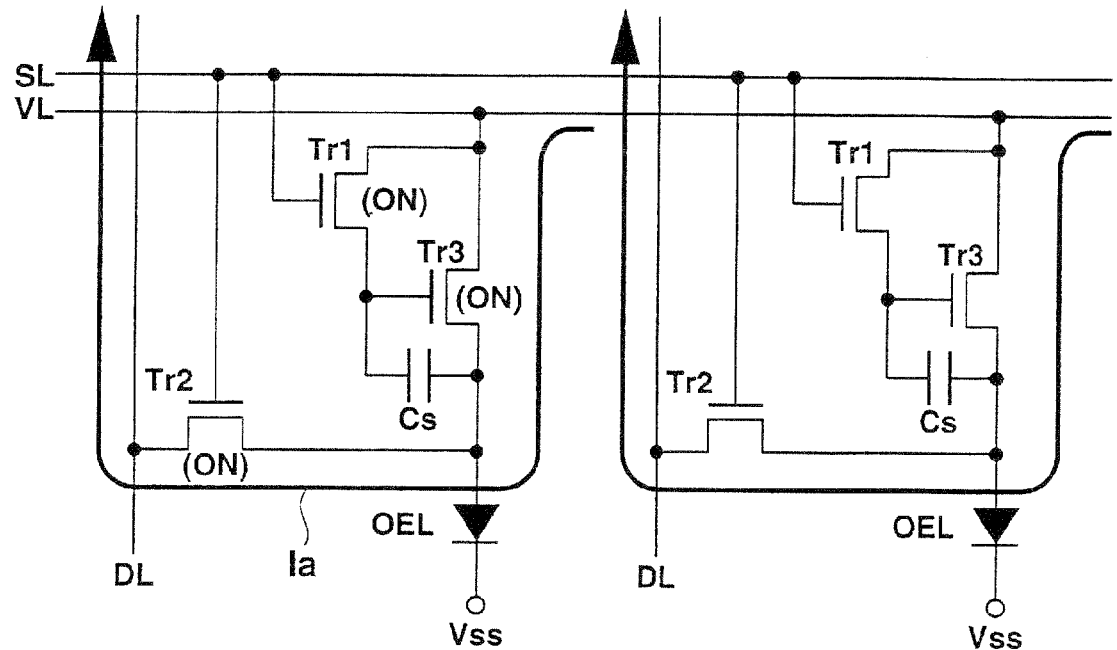
FIGS. 18A and 18B are conceptual views respectively showing a basic operation in the pixel drive circuit applicable to the embodiment.
Figure 18B:
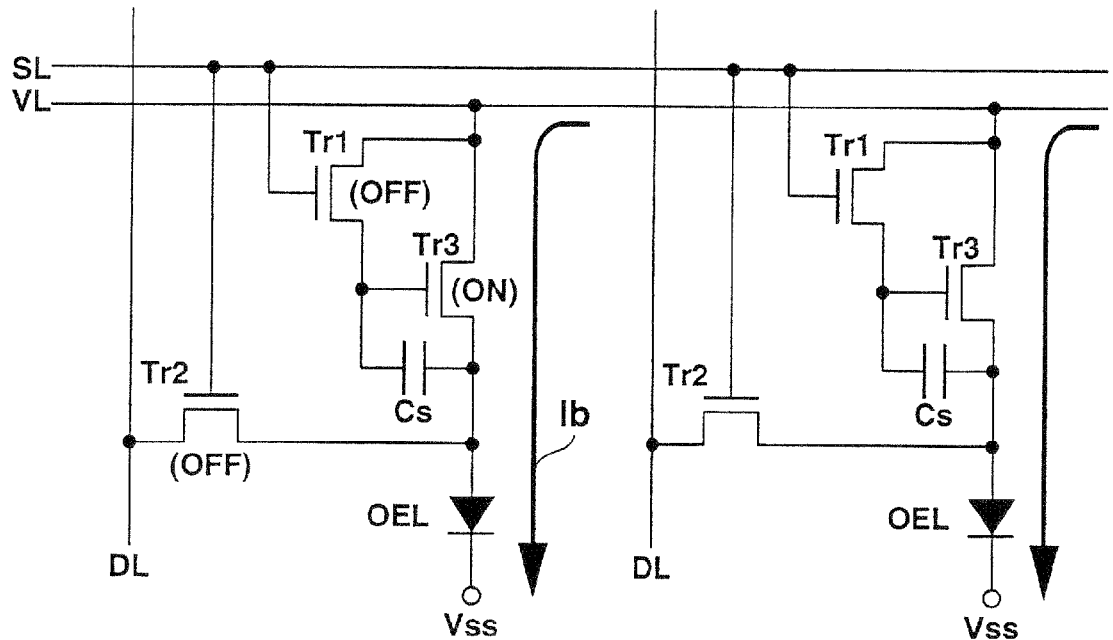
Figure 19:
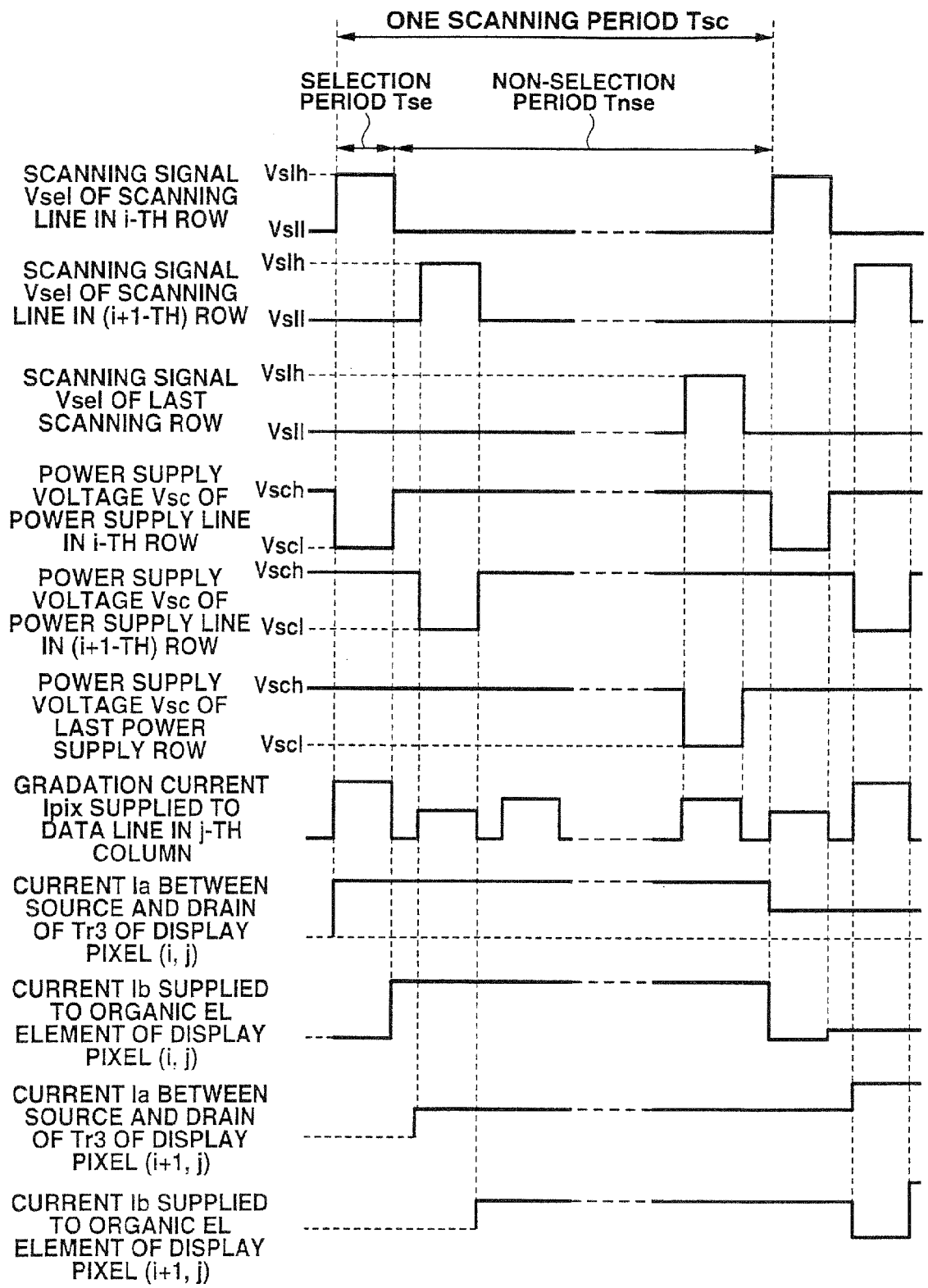
FIG. 19 is a timing chart showing a display timing of image information in the display apparatus according to the embodiment.

FIG. 17 is a circuit structural view showing an example of a basic structure of a pixel drive circuit applicable to the display apparatus according to the present invention, and FIGS. 18A and 18B are conceptual views showing a basic operation of the pixel drive circuit applicable to this embodiment. FIG. 19 is a timing chart showing a display timing of image information in the display apparatus according to this embodiment.

For example, as shown in FIG. 17, the pixel drive circuit DCx comprises an NMOS thin film transistor Tr1 having a gate terminal connected to a scanning line SL, a source terminal connected to a power supply line VL and a drain terminal connected to a junction N1; an NMOS thin film transistor Tr2 having a gate terminal connected to the scanning line SL, and source and drain terminals respectively connected to a data line DL and a junction N2; an NMOS thin film transistor Tr3 having a gate terminal connected to the junction N1, and source and drain terminals respectively connected to a power supply line VL and the junction N2; and a capacitor Cs connected between the junction N1 and the junction N2, in the vicinity of each intersection of the scanning line SL and the data line DL arranged so as to be orthogonal to the display panel 110. The light emitting element (organic EL element OEL) has an anode terminal connected to the junction N2 and a cathode terminal connected to a ground potential, respectively. Here, the capacitor Cs may be a parasitic capacitance formed between the gate and the source of the thin film transistor Tr3. It is to be noted that the organic EL element OEL is used as the light emitting element in this example, but the light emitting element is not restricted thereto as described above.

For example, as shown in FIG. 19, the light emitting drive control of the light emitting element (organic EL element) in the pixel drive circuit having such a structure is executed by setting a write operation period (or a selection period of the display pixels) in which a display pixel group connected to a specific scanning line is selected and a signal current corresponding to display data is written within one scanning period Tsc which is determined as one cycle and this signal current is held as a signal voltage, and a light emitting operation period (or a non-selection period of the display pixels) in which a drive current according to the display data is supplied to the organic EL element based on the signal voltage written and held in the write operation period and the light emitting operation is performed with a predetermined brightness gradation (Tsc=Tse+Tnse). Here, the write operation periods Tse set for the respective lines are set so as not overlap in time.

(Write Operation Period: Selection Period)

In the write operation (selection period Tse) for the display pixels, as shown in FIG. 19, a high-level scanning signal Vsel (Vslh) is applied to the scanning line SL in a specific line (i-th line) from the scanning driver 120, and a low-level power supply voltage Vscl is applied to the power supply line VL in this line (i-th line) from the power supply driver 140. In synchronization with this timing, the gradation current having the negative polarity (−Ipix) corresponding to display data of the line fetched by the data driver 130 is supplied to each data line DL.

As a result, the thin film transistors Tr1 and Tr2 constituting the pixel drive circuit DCx perform the on operation, and the low-level power supply voltage Vscl is applied to the junction N1 (that is, the gate terminal of the thin film transistor Tr3 and one end of the capacitor Cs), and the operation to pull in the gradation current having the negative polarity (−Ipix) via the data line DL is carried out. As a result, a voltage level having a lower potential than the low-level power supply voltage Vscl is applied to the junction N2 (that is, the source terminal of the thin film transistor Tr3 and the other end of the capacitor Cs).

As described above, generation of a potential difference between the junction N1 and the N2 (between the gate and the source of the thin film transistor Tr3) causes the thin film transistor Tr3 to perform the on operation and, as shown in FIG. 18A, a write current Ia corresponding to the gradation current Ipix flows down to the data driver 130 from the power supply line VL via the thin film transistor Tr3, the junction N2, the thin film transistor Tr2 and the data line DL.

At this moment, electric charges corresponding to the potential difference generated between the junctions N1 and N2 (between the gate and the source of the thin film transistor Tr3) are stored in the capacitor Cs, and it is held (charged) as a voltage component. Further, since the power supply voltage Vscl having a voltage level equal to or less than a ground potential is applied to the power supply line VL and the write current Ia is controlled so as to flow in the data line direction, the potential applied to the anode terminal (junction N2) of the organic EL element OEL becomes lower than the potential (ground potential) of the cathode terminal, and a reverse bias voltage is applied to the organic EL element OEL. Therefore, the drive current does not flow through the organic EL element, and the light emitting operation is not executed.

(Light Emitting Operation Period: Non-Selection Period)

Subsequently, in the light emitting operation (non-selection period Tnse) of the organic EL element after completion of the write operation period (selection period Tse), as shown in FIG. 19, a low-level scanning signal Vsel (Vsell) is applied to the scanning line SL in a specific line (i-th line) from the scanning driver 120, and a high-level power supply voltage Vsch is applied to the power supply line VL in this line (i-th line) from the power supply driver 140. Further, in synchronization with this timing, the operation to pull in the gradation current by the data driver 130 is stopped.

As a result, the thin film transistors Tr1 and Tr2 constituting the pixel drive circuit DCx perform the off operation, application of the power supply voltage Vsc to the junction N1 (that is, the gate terminal of the thin film transistor Tr3 and one end of the capacitor Cs) is interrupted, and application of the voltage level to the junction N2 (that is, the source terminal of the think film transistor Tr3 and the other end of the capacitor Cs) due to the operation to pull in the gradation current by the data driver 130 is interrupted. As a result, the capacitor Cs holds the electric charges stored in the above-described write operation.

As described above, the capacitor Cs holds the charge voltage in the write operation, and a potential difference between the junctions N1 and N2 (between the gate and the source of the thin film transistor Tr3) is thereby held and the thin film transistor Tr3 maintains the on state. Further, since a power supply voltage Vsch having a voltage level higher than the ground potential is applied to the power supply line VL, the potential applied to the anode terminal (junction N2) of the organic EL element OEL becomes higher than the potential (ground potential) of the cathode terminal.

Therefore, as shown in FIG. 18B, a predetermined drive current Ib flows through the organic EL element OEL from the power supply line VL through the thin film transistor Tr3 and the junction N2 in a forward bias direction, and the organic EL element OEL emits the light. Here, since the potential difference (charge voltage) held by the capacitor Cs corresponds to a potential difference when causing the write current Ia corresponding to the gradation current Ipix to flow in the thin film transistor Tr3, the drive current flowing through the organic EL element OEL has a current value equivalent to the write current Ia. As a result, in the non-selection period Tnse after the selection period Tse, the drive current is continuously supplied through the thin film transistor Tr3 based on a voltage component corresponding to the display data (gradation current) written in the selection period Tse. The organic EL element OEL continues the operation to emit the light with the brightness gradation corresponding to the display data.

As shown in FIG. 19, by sequentially repeatedly executing the above-described series of operation with respect to the display pixel groups for all the lines constituting the display panel, the display data for one screen of the display panel is written, the light is emitted with a predetermined brightness gradation, and desired image information is displayed.

Although the thin film transistors Tr1 to Tr3 applied to the pixel drive circuit according to this embodiment are not particularly restricted, all of the thin film transistors Tr1 to Tr3 can be constituted by n-channel type transistors, and hence an n-channel type amorphous silicon TFT can be excellently applied. In such a case, the pixel drive circuit having the stable drive characteristic can be relatively inexpensively manufactured by applying the already established manufacturing technique.

Further, according to the pixel drive circuit having the above-described circuit configuration, even if the characteristic of the thin film transistor Tr3 or the light emitting element is deteriorated due to an aged change, the potential difference (charge voltage) held in the capacitor Cs becomes a potential difference required for passing the write current Ia corresponding to the gradation current Ipix to the thin film transistor Tr3. Therefore, the drive current Ib flowing down through the organic EL element OEL is maintained at a current value equivalent to the write current Ia. Thus, it is possible to suppress degradation of the display state such as generation of display irregularities due to an aged change, thereby maintaining the excellent display state.

Figure 20:
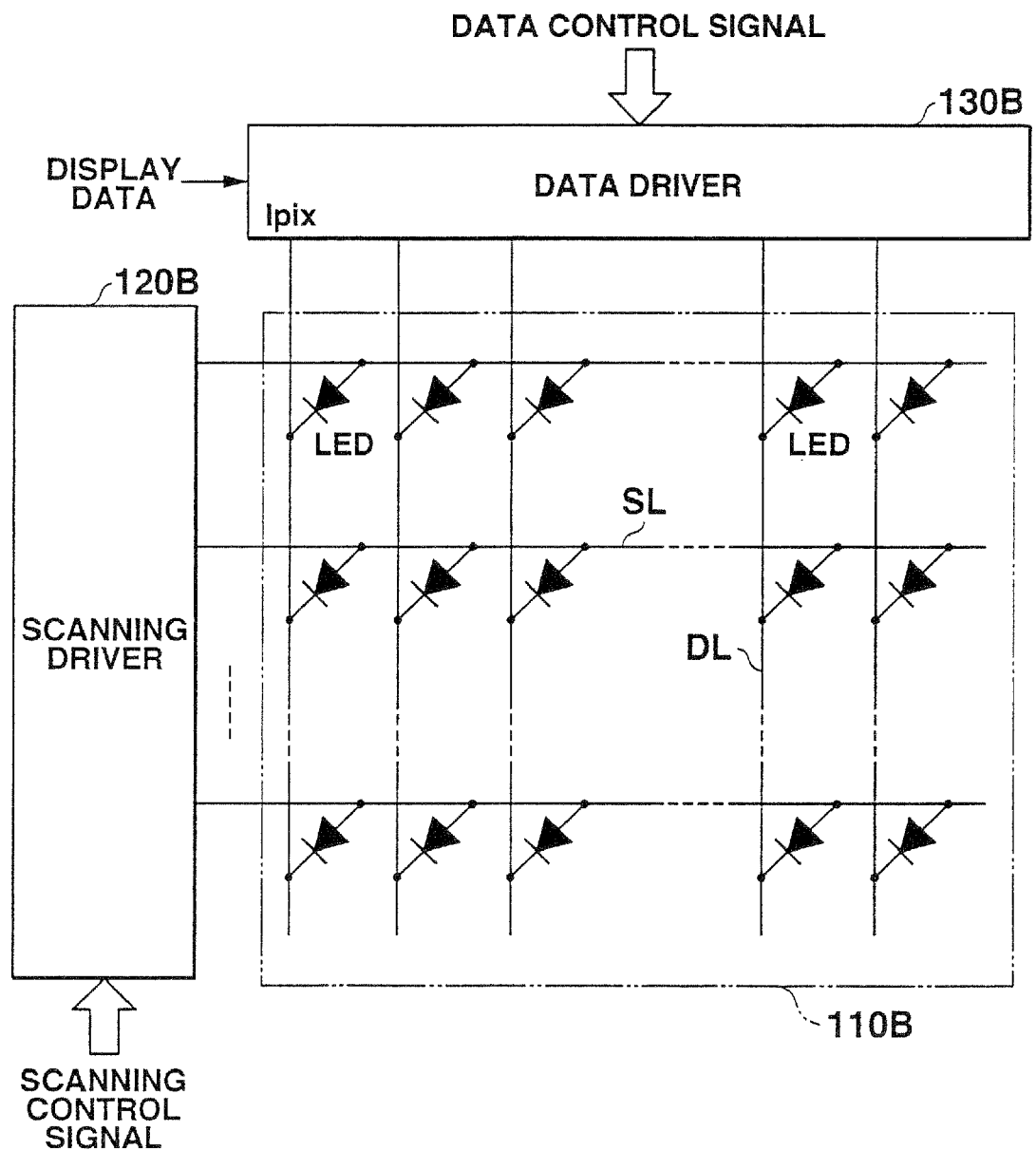
FIG. 20 is a schematic block diagram showing a primary structure of still another example of the display apparatus according to the present invention.

FIG. 20 is a schematic block diagram showing a primary structure of another example of the display apparatus according to the present invention.

In the above-described embodiment, although the display apparatus (display panel) adopting the active matrix type drive mode including the pixel drive circuit for each display pixel of the display panel has been described, the present invention is not restricted thereto. As shown in FIG. 20, it is needless to say that it is possible to excellently apply the display apparatus adopting a simple matrix (passive matrix) type display panel such as an organic EL element OEL or a light emitting diode LED having an anode and a cathode respectively connected to the scanning line and the data line in the vicinity of an intersection of the data line DL extending from the data driver 130B and the scanning line SL extending from the scanning driver 120B. It is to be noted that, in FIG. 20, that the light emitting diode LED is used as the light emitting element. In this case, since the gradation control can be executed by individually supplying the light emitting drive current having a predetermined current value corresponding to the display data to each light emitting element, the excellent multi-gradation display can be realized while increasing the display speed of image information.

Furthermore, in the display apparatus adopting the simple matrix type display panel illustrated in FIG. 20, it is possible to adopt any one of the structures of the current drive apparatuses described in conjunction with the first to ninth embodiments as the data driver 130B.

Specifically, in the single current generation circuit, currents having a predetermined fixed current value are generated, the currents are sequentially fetched and held in the respective current storage circuits provided in accordance with a plurality of the output terminals of the respective driver chips, and the held currents are simultaneously outputted to the respective data lines arranged in the display panel through the respective output terminals in a predetermined display period in an individual supply time (pulse width) based on the display data consisting of the digital signals by applying the known pulse width modulation (PWM) drive mode. As a result, since it is possible to cause each light emitting element to perform the light emitting operation with a predetermined brightness gradation corresponding to the display data, image information can be excellently displayed in the multi-gradation.

In the foregoing embodiment of the display apparatus, although description has been given as to the circuit configuration including the three thin film transistors as the pixel drive circuit included in each display pixel of the display panel, the present invention is not restricted to this embodiment, and it is possible to adopt a circuit configuration including, e.g., four thin film transistors.

Moreover, it is possible to adopt any other circuit configuration as long as it is a display apparatus including the image drive circuit to which a current specification mode including a conformation to apply the gradation current from the data line is applied as well as a current specification mode which pulls in the gradation current from the data line, has a light emitting control transistor which controls supply of the drive current to the light emitting element and a write control transistor which controls the write operation of the gradation current, supplies the drive current by causing the light emitting control transistor to perform the on operation based on the write current after holding the write current according to the display data, and causes the light emitting elements to emit the light with a predetermined brightness gradation.

Additionally, the light emitting element arranged in each display pixel is not particularly restricted, and it is possible to adopt any other light emitting element than the organic EL element or the light emitting diode described above as long as it performs the light emitting operation with a predetermined brightness gradation according to a current value of the light emitting drive current supplied thereto.

Although the above has described the case that the current drive apparatus according to the present invention is applied to the display drive circuit of the display apparatus, the current drive apparatus according to the present invention is not restricted to such a display drive apparatus. For example, it is possible to apply the current drive apparatus to a drive circuit of a device including many elements which drive by application of a current, such as a drive circuit of a printer head formed by arranging many light emitting diodes.

As described above, according to the current drive apparatus and its drive method of the present invention, in the technique to operate each load in a predetermined drive state by supplying a predetermined drive current to each of the plurality of loads such as a plurality of arranged light emitting elements, operating currents having a predetermined current value are generated and outputted by the single current generation circuit, they are supplied to the plurality of current storage circuits individually formed on, e.g., a plurality of the semiconductor chips, and corresponding voltage components are held. Therefore, the currents having the uniform current characteristic supplied from the single current source are held in the respective current storage circuits of the respective semiconductor chips. Therefore, it is possible to use the relatively simple apparatus structure to restrain irregularities in the drive current between the respective semiconductor chips and between the output terminals provided to the same semiconductor chip.

Additionally, by applying the current drive apparatus according to the present invention to the signal drive circuit (data driver) of the display apparatus, it is possible to suppress irregularities in the drive current between the driver chips (semiconductor chips) and between the output terminals provided to the same driver chip and restrain generation of display irregularities, thereby improving the display image quality.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current drive apparatus which operates a plurality of loads by applying a current thereto, the current drive apparatus comprising:
   a single current generation circuit which outputs an operating current having a predetermined current value;
   a plurality of input current storage circuits connected to the single current generation circuit; and
   a plurality of current storage circuit groups each including a predetermined number of current storage circuits which are connected to the input current storage circuits;
   wherein the current storage circuits are connected to output terminals connected to each of said plurality of loads;
   wherein each of the input current storage circuits sequentially fetches, through an input side switch circuit, the operating current output from the single current generation circuit, holds a voltage component corresponding to a current value of the operating current, and simultaneously outputs, under control of a shift register section, the operating current based on the held voltage component to each of the component storage circuit groups in parallel; and
   wherein the current storage circuits of each of the plurality of current storage circuit groups sequentially fetch the operating current output from each of the input current storage circuits, hold the voltage component corresponding to the current value of the operating current, and simultaneously output, through a control circuit, a drive current based on the held voltage component to the output terminals.

2. The current drive apparatus according to claim 1, wherein each of the input current storage circuits and each of the current storage circuits of each of said current storage circuit groups comprises a voltage component holding section which holds the voltage component corresponding to the current value of the operating current.

3. The current drive apparatus according to claim 1, wherein each of the current storage circuits of each of said current storage circuit groups comprises:
   a pair of current storage sections arranged in parallel with each other;
   wherein the current storage circuits alternately perform an operation to fetch the operating current output from the current generation circuit and hold the voltage component corresponding to the current value of the operating current in one of the current storage sections, and an operation to output the drive current based on the voltage component held in the other current storage section in parallel.

4. The current drive apparatus according to claim 1, wherein each of the input current storage circuits and each of the current storage circuits include a capacitance element in which electric charges corresponding to the operating current are written as the voltage component.

5. The current drive apparatus according to claim 1, wherein the input current storage circuits comprise:
   a pair of input current storage sections arranged in parallel with each other;
   wherein the input current storage circuits alternately perform an operation to fetch the operating current output from the current generation circuit in one of the input current storage sections and hold the voltage component corresponding to the current value of the operating current in said one of the input current storage sections, and an operation to supply the operating current based on the voltage component held in the other input current storage section to the plurality of the current storage circuits in the other input current storage section in parallel.

6. A drive method of a current drive apparatus which operates a plurality of loads connected to a plurality of output terminals by applying a current thereto, the current drive apparatus comprising a single current generation circuit which outputs an operating current having a predetermined current value, a plurality of input current storage circuits connected to the single current generation circuit, and a plurality of current storage circuit groups each including a predetermined number of current storage circuits which are connected to the input current storage circuits and to the output terminals connected to said plurality of loads, the drive method comprising:
   generating the operating current by the current generation circuit, and outputting the operating current to each of the plurality of current storage circuits;
   sequentially fetching, through an input side switch circuit, the operating current in the input current storage circuits, and holding a voltage component corresponding to a current value of the operating current;
   applying, under control of a shift register section, the operating current based on the voltage component held in the input current storage circuits to the respective current storage circuit groups in parallel;
   sequentially fetching the operating current applied from each of the input current storage circuits into the current storage circuits of each of the current storage circuit groups, and holding the voltage component according to the current value of the operating current in the current storage circuit; and simultaneously outputting, through a control circuit, a drive current based on the voltage component held in the current storage circuits to the output terminals.

7. The drive method of a current drive apparatus according to claim 6, wherein the holding the voltage component of the operating current in the input current storage circuits and the applying the drive current based on the held voltage component to the output terminals are performed in parallel.

8. A display apparatus comprising:
a display panel having a plurality of scanning lines arranged in a row direction, a plurality of signal lines arranged in a column direction, and a plurality of display pixels each arranged in a vicinity of an intersection of the respective scanning lines and signal lines and having an optical element, in which a drive current according to a display signal is output to each of the display pixels of the display panel in order to display image information;
a signal drive circuit which outputs the drive current to each of the signal lines; and
a scanning drive circuit which outputs to each of the scanning lines a scanning signal used to sequentially select the display pixel connected to the scanning lines;
the signal drive circuit comprising:
a single current generation circuit which generates and outputs an operating current having a current value based on the display signal;
a plurality of input current storage circuits connected to the single current generation circuit; and
a plurality of current storage circuit groups each including a predetermined number of current storage circuits which are connected to the input current storage circuits;
wherein said plurality of current storage circuits are connected to a plurality of output terminals which are respectively connected to the signal lines;
wherein each of the input current circuits sequentially fetches, through an input side switch circuit, the operating current output from the current generation circuit, holds a voltage component corresponding to a current value of the operating current, and applies, under control of a shift register section, the operating current based on the held voltage component to the component storage circuit groups in parallel; and
wherein the current storage circuits of each of the plurality of current storage circuit groups sequentially fetch the operating current output from each of the input current storage circuits, hold the voltage component corresponding to the current value of the operating current, and simultaneously output, through a control circuit, a drive current based on the held voltage component to the output terminals.

9. The display apparatus according to claim 8, wherein the optical element in the display pixel includes a light emitting element.

* * * * *

UNITED STATES PATENT AND TRADEMARK OFFICE
CERTIFICATE OF CORRECTION

| | | |
|---|---|---|
| PATENT NO. | : 8,094,095 B2 | Page 1 of 1 |
| APPLICATION NO. | : 11/854341 | |
| DATED | : January 10, 2012 | |
| INVENTOR(S) | : Reiji Hattori | |

It is certified that error appears in the above-identified patent and that said Letters Patent is hereby corrected as shown below:

On the title page:

Under Item (73) Assignee;

after "Casio Computer Co., Ltd. Tokyo (JP)"

insert --Reiji Hattori, Fukuoka-shi (JP)--.

Signed and Sealed this
Twenty-ninth Day of May, 2012

David J. Kappos
*Director of the United States Patent and Trademark Office*